(12) United States Patent
Kang

(10) Patent No.: US 9,941,206 B2
(45) Date of Patent: Apr. 10, 2018

(54) INTERCONNECTION STRUCTURES FOR SEMICONDUCTOR DEVICES AND METHODS OF FABRICATING THE SAME

(71) Applicant: Minsung Kang, Yongin-si (KR)

(72) Inventor: Minsung Kang, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 134 days.

(21) Appl. No.: 14/087,919

(22) Filed: Nov. 22, 2013

(65) Prior Publication Data

US 2014/0210087 A1 Jul. 31, 2014

(30) Foreign Application Priority Data

Jan. 29, 2013 (KR) .................. 10-2013-0010018

(51) Int. Cl.
*H01L 23/528* (2006.01)
*H01L 23/532* (2006.01)
*H01L 27/108* (2006.01)

(52) U.S. Cl.
CPC .......... *H01L 23/528* (2013.01); *H01L 23/532* (2013.01); *H01L 23/53233* (2013.01); *H01L 23/53238* (2013.01); *H01L 23/53266* (2013.01); *H01L 27/10894* (2013.01); *H01L 27/10897* (2013.01); *H01L 27/10808* (2013.01); *H01L 2924/0002* (2013.01)

(58) Field of Classification Search
CPC ........................... H01L 23/528; H01L 23/532
See application file for complete search history.

(56) References Cited

U.S. PATENT DOCUMENTS

| | | | |
|---|---|---|---|
| 6,077,768 A | 6/2000 | Ong et al. | |
| 6,726,996 B2 | 4/2004 | Barth et al. | |
| 6,756,672 B1 * | 6/2004 | You | H01L 21/76802 |
| | | | 257/637 |
| 7,060,619 B2 | 6/2006 | Cowley et al. | |
| 7,166,532 B2 | 1/2007 | Chun | |
| 7,452,801 B2 | 11/2008 | Ryu et al. | |
| 7,569,475 B2 | 8/2009 | Yang et al. | |
| 7,737,026 B2 | 6/2010 | Li et al. | |

(Continued)

FOREIGN PATENT DOCUMENTS

| | | |
|---|---|---|
| CN | 101536170 A | 9/2009 |
| KR | 10-1998-0040625 | 8/1998 |

(Continued)

*Primary Examiner* — Joseph C Nicely
*Assistant Examiner* — Lamont Koo
(74) *Attorney, Agent, or Firm* — Myers Bigel, P.A.

(57) ABSTRACT

An interconnection structure includes an underlying layer including a lower interconnection, and an interlayered dielectric layer including a contact hole and a trench therein. The contact hole exposes a portion of the lower interconnection, and the trench extends along a first direction to be connected to the contact hole. A contact plug extends through the contact hole in the interlayered dielectric layer, and an upper interconnection line extends in the trench of the interlayered dielectric layer and connects to the contact plug. The contact plug includes lower and upper sidewalls inclined at first and second angles, respectively, relative to the underlying layer, and the second angle is less than the first angle. Related devices and fabrication methods are also discussed.

22 Claims, 25 Drawing Sheets

(56) References Cited

U.S. PATENT DOCUMENTS

| | | | |
|---|---|---|---|
| 8,283,046 B2 | 10/2012 | Takayama | |
| 2003/0042610 A1* | 3/2003 | Kitada | H01L 21/76843 257/758 |
| 2003/0134510 A1* | 7/2003 | Lee | C25D 5/022 438/674 |
| 2005/0221601 A1* | 10/2005 | Kawano | H01L 21/76898 438/622 |
| 2006/0046456 A1* | 3/2006 | An | H01L 21/2885 438/597 |
| 2006/0097397 A1 | 5/2006 | Russell | |
| 2008/0111239 A1* | 5/2008 | Yang | H01L 21/76847 257/751 |
| 2009/0134471 A1* | 5/2009 | Chatterjee | H01L 21/76816 257/383 |
| 2010/0022086 A1* | 1/2010 | Choi | H01L 21/76814 438/653 |
| 2010/0202208 A1* | 8/2010 | Endo | G11C 16/0466 365/185.18 |
| 2012/0061766 A1* | 3/2012 | Izumi | H01L 21/26586 257/369 |

FOREIGN PATENT DOCUMENTS

| | | |
|---|---|---|
| KR | 1020030053542 | 7/2003 |
| KR | 1020050009528 | 1/2005 |

\* cited by examiner

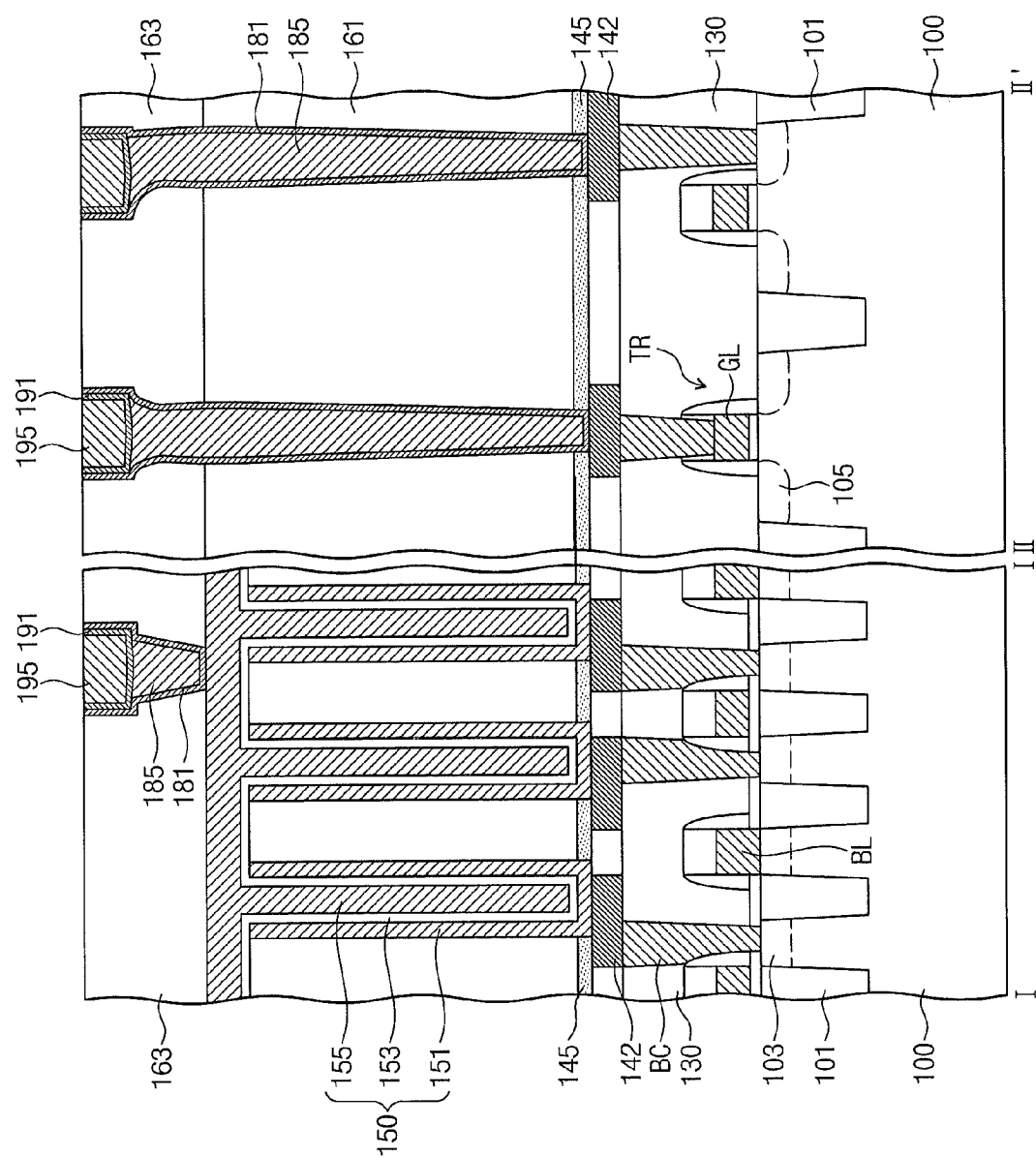

INTERCONNECTION STRUCTURES FOR SEMICONDUCTOR DEVICES AND METHODS OF FABRICATING THE SAME

CROSS-REFERENCE TO RELATED APPLICATIONS

This U.S. non-provisional patent application claims priority under 35 U.S.C. § 119 to Korean Patent Application No. 10-2013-0010018, filed on Jan. 29, 2013, in the Korean Intellectual Property Office, the entire contents of which are hereby incorporated by reference.

BACKGROUND OF THE INVENTION

Example embodiments of the inventive concept relate to semiconductor devices and methods of fabricating the same, and in particular, to interconnection structures for semiconductor devices and methods of forming the same.

Due to their small-size, multifunctionality, and/or low-cost characteristics, semiconductor devices are important elements in the electronic industry. Semiconductor devices may include several unit components (e.g., MOS transistor, resistor, capacitor, and/or interconnection line). The unit components may include various patterns (e.g., conductive line, doped region, device isolation pattern, hole, and/or electrode).

However, as an integration density of the semiconductor device increases, several technical problems can arise in fabricating semiconductor devices. For example, with increases in density and/or height of patterns, there may be increased difficulty (e.g., a reduction in process margin) in performing a photolithography process and/or an etching process.

SUMMARY

Example embodiments of the inventive concept provide highly-reliable interconnection structures for a semiconductor device.

Other example embodiments of the inventive concept provide methods of forming highly-reliable interconnection structures for a semiconductor device.

According to example embodiments of the inventive concepts, and interconnection structure includes a substrate, an interlayer dielectric layer on the substrate, and a conductive plug extending through the interlayer dielectric layer to the substrate. The conductive plug includes upper and lower sidewall portions having different angles of inclination relative to a surface of the substrate. A conductive line on the interlayer dielectric layer contacts the conductive plug opposite the substrate.

In some example embodiments, the lower and upper sidewall portions of the conductive plug may be inclined at a first angle and a second angle, respectively, relative to the surface of the substrate, where the second angle is less than the first angle.

In some example embodiments, a cross-sectional area of an upper portion of the conductive plug adjacent the upper sidewall portion thereof and contacting the conductive line may be greater than a cross-sectional area of a lower portion of the conductive plug adjacent the lower sidewall portion thereof.

In some example embodiments, a dimension of the upper portion of the conductive plug along a first direction in which the conductive line extends may be greater than a dimension thereof along a second direction perpendicular to the first direction.

In some example embodiments, the lower portion of conductive plug may have a substantially circular cross section, and the upper portion of the conductive plug may have an elliptical cross section.

In some example embodiments, a cross-sectional area of a bowed portion of the conductive plug between the upper and lower portions thereof may be greater than that of the upper portion thereof.

In some example embodiments, the interlayer dielectric layer may include at least two dielectric layers. The conductive line may be spaced apart or otherwise separated from an interface between the at least two dielectric layers.

In some example embodiments, the substrate may include a cell region including data storage elements thereon and a peripheral circuit region including the conductive plug thereon. The conductive plug may extend away from the substrate beyond the data storage elements.

In some example embodiments, the conductive plug may include a first barrier metal layer along sidewalls of a contact hole extending through the interlayer dielectric layer to the substrate, and the conductive line may include a second barrier metal layer along sidewalls of a trench in the interlayer dielectric layer opposite the substrate. The second barrier layer may be directly on the first barrier layer along at least a portion of the floor of the trench.

In some example embodiments, the conductive plug may further include a first metal layer that is coplanar with or confined below the floor of the trench. The conductive line may include a second metal layer that is different than the first metal layer In some example embodiments, the contact hole may have an aspect ratio of about of about 1:2 to 1:10.

In some example embodiments, the conductive line may include a metal having a higher charge mobility than that of the conductive plug.

In some example embodiments, the contact hole may include a sacrificial material comprising carbon therein.

According to example embodiments of the inventive concepts, an interconnection structure of a semiconductor device may include an underlying layer including a lower interconnection, an interlayered dielectric layer including a contact hole and a trench, the contact hole exposing a portion of the lower interconnection, and the trench extending along a first direction to be connected to the contact hole, a contact plug provided in the contact hole of the interlayered dielectric layer, and an upper interconnection line provided in the trench of the interlayered dielectric layer and connected to the contact plug. In the first direction, the contact plug may include lower and upper sidewalls slanted or inclined at first and second angles, respectively, relative to the underlying layer, and the second angle may be less than the first angle.

In some example embodiments, the contact plug has a first upper width in the first direction and a second upper width in a second direction that may be perpendicular to the first direction, and the first upper width may be greater than the second upper width.

In some example embodiments, the second upper width may be less than a width of the trench.

In some example embodiments, the contact plug may include a first barrier metal layer covering inner surfaces of the contact hole and the trench, and a first metal layer filling the contact hole provided with the first barrier metal layer.

In some example embodiments, the upper interconnection line may include a second barrier metal layer the inner wall of the trench, and a second metal layer filling the trench provided with the second barrier metal layer. The second barrier metal layer may be in direct contact with the first barrier metal layer at side and bottom surfaces of the trench.

In some example embodiments, the contact plug may include a first metal material, and the upper interconnection line may include a second metal material that may be different from the first metal material.

In some example embodiments, the contact plug may include tungsten, and the upper interconnection line may include copper or copper alloy.

According to example embodiments of the inventive concepts, a semiconductor device may include a semiconductor substrate including a lower interconnection, an interlayered dielectric layer including a contact hole and a trench, the contact hole exposing a portion of the lower interconnection, and the trench extending along a first direction to be connected to the contact hole, a first barrier metal layer conformally covering inner surfaces of the contact hole and the trench, a first metal layer filling a portion of the contact hole provided with the first barrier metal layer, a second barrier metal layer being in direct contact with the first barrier metal layer at bottom and side surfaces of the trench, and a second metal layer filling the trench provided with the second barrier metal layer.

In some example embodiments, the contact hole may include lower and upper sidewalls slanted at first and second angles, respectively, relative to the underlying layer, and the second angle may be less than the first angle.

In some example embodiments, the contact hole has a first upper width in the first direction and a second upper width in a second direction that may be perpendicular to the first direction, and the first upper width may be greater than the second upper width.

In some example embodiments, the second upper width may be less than a width of the trench.

In some example embodiments, the semiconductor substrate may include a cell region provided with data storing elements and a peripheral circuit region provided with the contact hole and the trench, the interlayered dielectric layer cover the data storing elements of the cell region. A height of the contact hole may be greater than that of the data storing element.

In some example embodiments, the first metal layer may include tungsten, and the second metal layer may include copper or copper alloy.

According to example embodiments of the inventive concepts, a method of forming an interconnection structure of a semiconductor device may include forming an underlying layer including a lower interconnection, forming an interlayered dielectric layer on the underlying layer to include a contact hole exposing a portion of the lower interconnection and a trench extending along a first direction to be connected to the contact hole, forming a contact plug in the contact hole, the contact plug containing a first metal material, and forming an upper interconnection line provided in the trench and connected to the contact plug, the upper interconnection line containing a second metal material. The contact hole may include lower and upper sidewalls slanted or inclined at first and second angles, respectively, relative to the underlying layer, and the second angle may be less than the first angle.

In some example embodiments, the contact hole has a first upper width in the first direction and a second upper width in a second direction that is perpendicular to the first direction, and the first upper width may be greater than the second upper width.

In some example embodiments, the forming of the interlayered dielectric layer may include forming an insulating layer on the underlying layer, forming the contact hole to penetrate the insulating layer, forming a sacrificial layer to fill the contact hole, patterning the interlayered dielectric layer to form the trench exposing the sacrificial layer and extending along the first direction, and removing the sacrificial layer exposed by the trench to expose an inner surface of the contact hole.

In some example embodiments, the forming of the trench may include enlarging an upper width of the contact hole in the first direction.

In some example embodiments, the forming of the contact plug may include forming a first barrier metal layer to cover conformally inner surfaces of the contact hole and the trench, forming a first metal layer to fill the contact hole provided with the first barrier metal layer and the trench, and removing a portion of the first metal layer from the trench to expose the first barrier metal layer through bottom and side surfaces of the trench.

In some example embodiments, the forming of the upper interconnection line may include forming a second barrier metal layer to be in contact with the first barrier metal layer at the bottom and side surfaces of the trench, and forming a second metal layer to fill the trench provided with the second barrier metal layer.

According to example embodiments of the inventive concept, a method of forming an interconnection structure of a semiconductor device may include forming an interlayered dielectric layer on an underlying layer including a lower interconnection, forming a contact hole to expose a portion of the lower interconnection through the interlayered dielectric layer, patterning the interlayered dielectric layer to form a trench extending along a first direction, the trench being connected to the contact hole, forming a contact plug in the contact hole, the contact plug containing a first metal material, and forming an upper interconnection line provided in the trench and connected to the contact plug, the upper interconnection line containing a second metal material. The forming of the trench may include enlarging the trench or the contact hole in the first direction.

In some example embodiments, after the forming of the trench, the contact hole has lower and upper sidewalls slanted at first and second angles, respectively, relative to the underlying layer, and the second angle may be less than the first angle.

In some example embodiments, after the forming of the trench, an upper width of the contact hole may be greater in the first direction than in a second direction perpendicular to the first direction.

In some example embodiments, the forming of the trench may include forming a sacrificial layer to fill the contact hole, anisotropically etching the sacrificial layer and the interlayered dielectric layer to define the trench, and removing the sacrificial layer exposed by the trench to expose an inner surface of the contact hole.

In some example embodiments, the forming of the contact plug may include forming a first barrier metal layer to cover conformally inner surfaces of the contact hole and the trench, and forming a first metal layer to fill the contact hole provided with the first barrier metal layer and expose the first barrier metal layer through a bottom surface of the trench.

In some example embodiments, the forming of the upper interconnection line may include forming a second barrier metal layer to be in contact with the first barrier metal layer through the bottom and side surfaces of the trench, and forming a second metal layer to fill the trench provided with the second barrier metal layer.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 18 through 25 are sectional views illustrating a method of forming a data storing element according to some example embodiments of the inventive concept.

Figure 1:
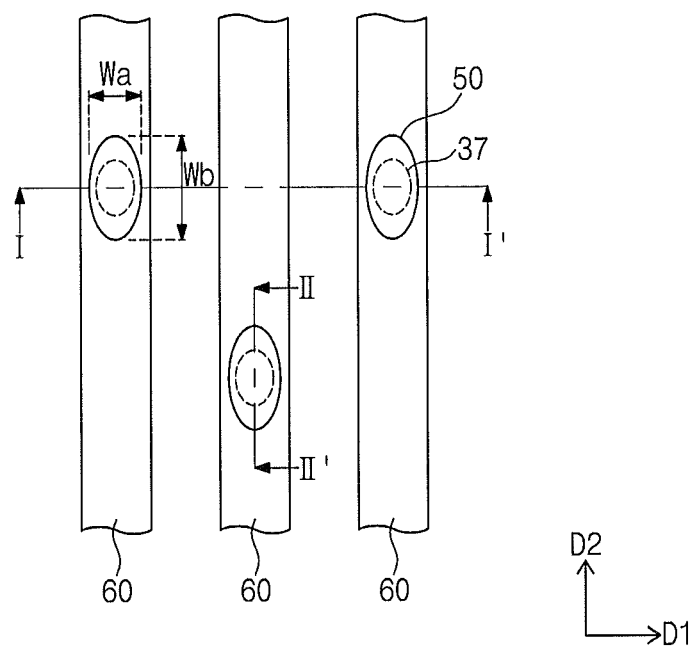
FIG. 1 is a plan view illustrating an interconnection structure of a semiconductor device according to some example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view illustrating an interconnection structure of a semiconductor device according to some example embodiments of the inventive concept. FIGS. 2 through 8 are sectional views illustrating a method of forming an interconnection structure of a semiconductor device according to some example embodiments of the inventive concept. In particular, FIGS. 2 through 8 are sectional views taken along lines I-I' and II-II' of FIG. 1.

Figure 2:
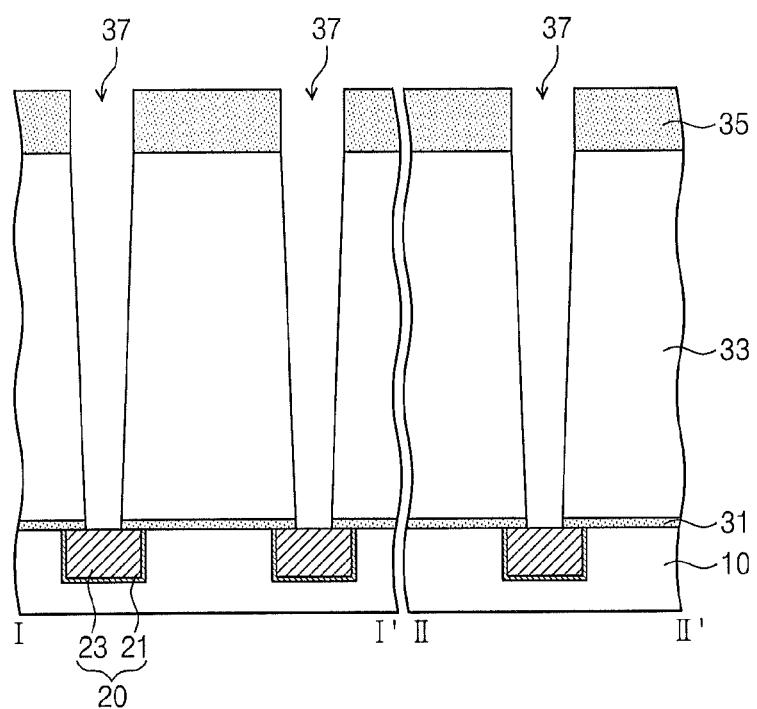
FIGS. 2 through 8 are sectional views illustrating a method of forming an interconnection structure of a semiconductor device according to some example embodiments of the inventive concept.

Referring to FIGS. 1 and 2, an interlayered dielectric layer 33 having contact holes 37 may be formed on an underlying layer 10 provided with lower interconnections 20.

The underlying layer 10 may include a semiconductor substrate, semiconductor devices (e.g., MOS transistors, capacitors, and resistor) provided on the semiconductor substrate, and at least one insulating layer covering the semiconductor devices. Here, the semiconductor devices may be electrically connected to the lower interconnections 20. The insulating layers may include low-k dielectric materials, whose dielectric constant is less than that of the silicon oxide layer. In example embodiments, at least one of the insulating layers may serve as an inter-metal dielectric (IMD) layer.

The lower interconnections 20 may be formed of one or more metallic materials having low resistivity. The lower interconnections 20 may be formed by a process of patterning a metal layer or a damascene process. Each of the lower interconnections 20 may include a barrier metal layer 21 and a metal layer 23. The barrier metal layer 21 may include, for example, Ti, Ta, Mo, TixNy, TaxNy, TixZry, TixZryNz, NbxNy, ZrxNy, WxNy, VxNy, HfxNy, MoxNy, RuxNy, and/or TixSiyNz. The metal layer 23 may include, for example, tungsten, copper, and/or aluminum.

The interlayered dielectric layer 33 may be provided to have a single-layered structure or a multi-layered structure. The interlayered dielectric layer 33 may include low-k dielectric materials, whose dielectric constant is less than that of the silicon oxide layer, and it may serve as an inter-metal dielectric (IMD) layer. For example, the interlayered dielectric layer 33 may include or be formed of high-density plasma (HDP) oxide, TetraEthylOrthoSilicate (TEOS), Plasma Enhanced TEOS (PE-TEOS), $O_3$-TEOS, Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), Tonen SilaZene (TOSZ), or any combination thereof. In some embodiments, the interlayered dielectric layer 33 may include or be formed of silicon nitride, silicon oxynitride, and/or low-k materials.

Further, an etch stop layer 31 may be formed between the underlying layer 10 and the interlayered dielectric layer 33. For example, the etch stop layer 33 may include or be formed of SiN, SiON, SiC, SiCN, BN (Boron nitride), or any combination thereof. The etch stop layer 31 and the interlayered dielectric layer 33 may be formed using plasma-enhanced CVD (PECVD), high-density plasma CVD (HDP-CVD), atmospheric-pressure CVD (APCVD), and/or a spin coating process.

Referring to FIGS. 1 and 2, the contact holes 37 may be formed to penetrate and extend through the interlayered dielectric layer 33 to expose portions of the lower interconnections 20.

The formation of the contact holes 37 may include forming a first mask pattern 35 on the interlayered dielectric layer 33, and then, anisotropically etching the interlayered dielectric layer 33 using the first mask pattern 35 as an etch mask. The first mask pattern 35 may be formed to have openings exposing portions of the interlayered dielectric layer 33.

Despite the use of the anisotropic etching process, the contact holes 37 may be formed to have an inclined or tapered sidewall. For example, a lower width of the contact hole 37 may be smaller than an upper width thereof. The contact holes 37 may have substantially a circular section in plan view and have a high aspect ratio of about 1:2 to 1:10. Further, during the formation of the contact holes 37, the etch stop layer 31 may be over-etched or removed to expose top surfaces of the lower interconnections 20.

After the formation of the contact holes 37, an ashing process or a wet cleaning process may be performed to remove the first mask pattern 35.

Figure 3:
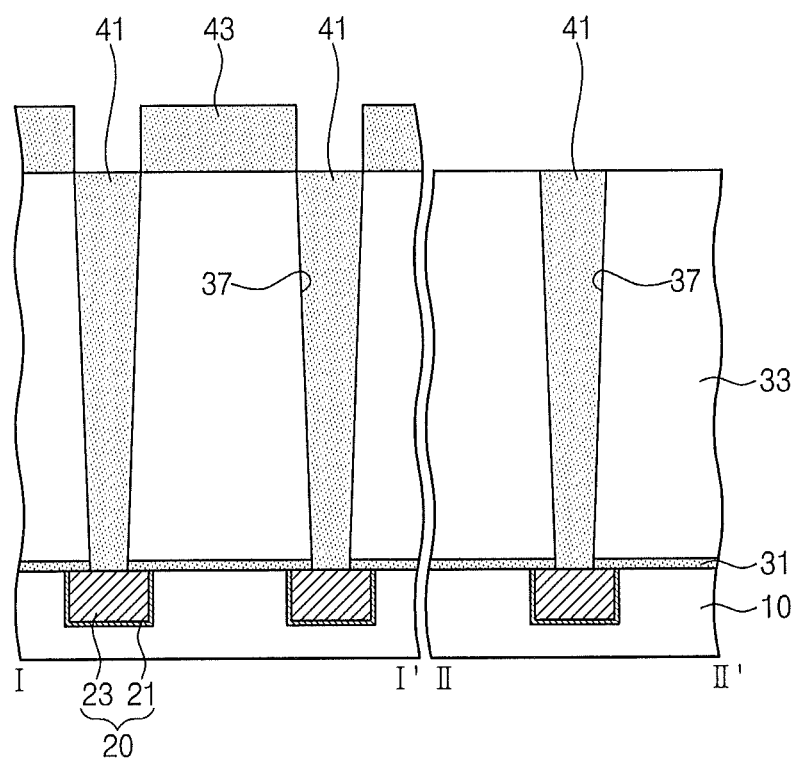

Referring to FIGS. 1 and 3, a sacrificial layer 41 may be formed to fill the contact holes 37. The sacrificial layer 41 may be formed using a spin coating process, which can make it possible to fill the contact holes 37 having high aspect ratio with the sacrificial layer 41. The sacrificial layer 41 may be formed of a material having an etch selectivity with respect to the interlayered dielectric layer 33. In example embodiments, the sacrificial layer 41 may be formed of a material whose main constituent is carbon. For example, the sacrificial layer 41 may be formed of a layer made of carbon and hydrogen or a layer made of carbon, hydrogen, and oxygen. Further, the sacrificial layer 41 may be formed of a layer having a relatively high carbon content of about 80-99 wt % with respect to a total weight of the sacrificial layer 41. In example embodiments, the sacrificial layer 41 may be formed of a spin-on-hardmask (SOH) layer or an amorphous carbon layer (ACL). The SOH layer may include a carbon-based SOH layer or a silicon-based SOH layer. In other example embodiments, the sacrificial layer 41 may be formed of a photoresist layer or an amorphous silicon layer.

In example embodiments, the formation of the sacrificial layer 41 may include coating the sacrificial layer 41 on the interlayered dielectric layer 33 with the contact holes 37 and baking the resulting structure at a temperature of about 100-500° C. for about 30-300 sec. Further, the baking process may be performed at least two times under different temperature conditions.

After the formation of the sacrificial layer 41, a second mask pattern 43 may be formed on the interlayered dielectric layer 33 to form trenches. The second mask pattern 43 may be provided to have a line-and-space structure. For example, the second mask pattern 43 may include line-shaped patterns that are spaced apart from each other in a first direction D1 and extend along a second direction D2 perpendicular to the first direction D1. Further, the second mask pattern 43 may be formed to expose the top surfaces of the sacrificial layer 41 provided in the contact holes 37.

The second mask pattern 43 may be formed of a material that can be etched by an etching gas for etching the sacrificial layer 41. For example, the second mask pattern 43 may be formed to have an etch selectivity of about 1:1 to 1:2, in a process of etching the sacrificial layer 41. This means that the second mask pattern 43 and the sacrificial layer 41 may be etched together. In example embodiments, the second mask pattern 43 may be formed of a photoresist layer, a spin-on-hardmask (SOH) layer, or an amorphous carbon layer.

Figure 4:
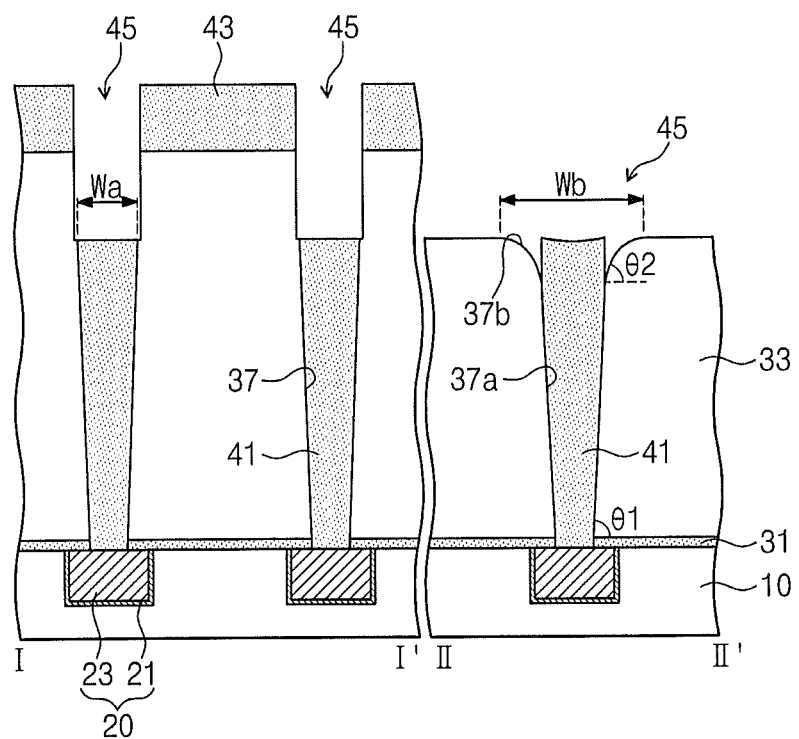

Referring to FIGS. 1 and 4, the second mask pattern 43 may be used to form trenches 45 in the interlayered dielectric layer 33. The trenches 45 may be formed by anisotropically etching the interlayered dielectric layer 33 using the second mask pattern 43 as an etch mask. The trenches 45 may be formed to be spaced apart from each other in the first direction D1 and be elongated along the second direction D2. In example embodiments, the interlayered dielectric layer 33 may include a plurality of insulating layers, and in this case, the trenches 45 may be formed in one of the insulating layers. For example, the trenches 45 may be formed in such a way that its bottom surface is vertically spaced apart from an interface between the stacked insulating layers.

In example embodiments, top surfaces of the second mask pattern 43 and the sacrificial layer 41 may be recessed during the anisotropic etching process for forming the trenches 45. For example, the interlayered dielectric layer 33 and the sacrificial layer 41 may be partially etched to form the trenches 45, and during the anisotropic etching process, a sidewall of the interlayered dielectric layer 33 in contact with the sacrificial layer 41 may be etched along a longitudinal direction of the trenches 45 or along the second direction. The formation of the trenches 45 may lead to an increase in an upper width of the contact holes 37 (e.g., in the second direction D2). For example, upper portions of the contact holes 37 may be expanded in the second direction D2, and in plan view, each of the contact holes 37 may be shaped like an ellipse. In other words, in plan view, each of the expanded contact holes 37 may be formed to have an upper width Wa in the first direction D1 and an upper width Wb in the second direction D2, and the upper width Wb in the second direction D2 may be greater than the upper width Wa in the first direction D1. Further, the interlayered dielectric layer 33 may have a slanted or inclined sidewall at a portion where the trenches 45 are connected to the contact holes 37. For example, after the formation of the trenches 45, the contact holes 37 may be formed to have a lower sidewall 37a slanted at a first angle θ1 relative to the underlying layer 10 and an upper sidewall 37b slanted at a second angle θ2 relative to the underlying layer 10. In example embodiments, the second angle θ2 may be less than the first angle θ1.

Next, the sacrificial layer 41 in the contact holes 37 and the second mask pattern 43 may be removed, after the formation of the trenches 45. In the case where the sacrificial layer 41 is formed of a SOH layer or a photoresist layer, the sacrificial layer 41 may be removed by an ashing process using oxygen, ozone, or ultraviolet light or a wet cleaning process. For example, in the case where the sacrificial layer 41 is formed of the SOH layer, the removal of the sacrificial layer 41 may be performed using a mixture of fluorine-based etching gas and $O_{-2}$ or a mixture of fluorine-based etching gas, $O_2$, and Ar. Here, the fluorine-based etching gas may be $C_3F_6$, $C_4F_6$, $C_4F_8$, and/or $C_5F_8$. In the case where the sacrificial layer 41 is formed of the amorphous silicon layer, the removal of the sacrificial layer 41 may be isotropically performed using chlorine gas. The second mask pattern 43 and the sacrificial layer 41 may have a similar etching property, and thus, the second mask pattern 43 may be removed in the ashing process or the wet cleaning process for removing the sacrificial layer 41.

Figure 5:
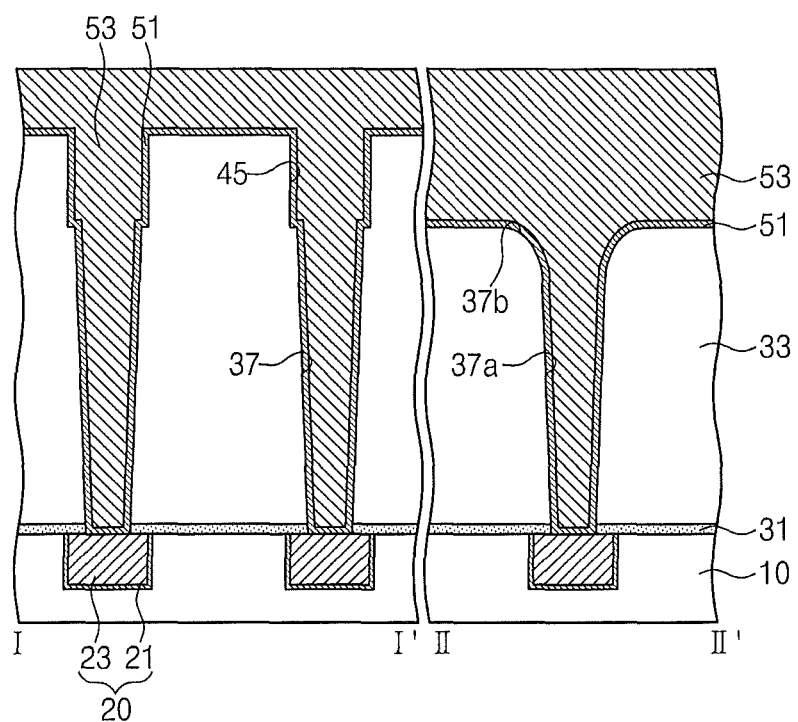

Referring to FIGS. 1 and 5, a first barrier metal layer 51 may be conformally formed on inner walls of the contact holes 37 and the trenches 45. For example, the first barrier metal layer 51 may cover the inner walls of the contact holes 37 and the trenches 45 and a top surface of the interlayered dielectric layer 33 with a uniform thickness. The first barrier metal layer 51 may be formed of a material capable of reducing or preventing a metallic material provided in the contact holes 37 and the trenches 45 from being diffused into the interlayered dielectric layer 33. For example, the first barrier metal layer 51 may be formed of Ta, TaN, TaSiN, Ti, TiN, TiSiN, W, WN, or any combination thereof. Further, the first barrier metal layer 51 may have a thickness of about 5 Å to 50 Å. The first barrier metal layer 51 may be formed using a chemical vapor deposition (CVD), an atomic layer deposition (ALD) or a physical vapor deposition (PVD) (e.g., sputtering).

Next, a first metal layer 53 may be formed to fill the contact holes 37 and the trenches 45 provided with the first barrier metal layer 51. In example embodiments, the first metal layer 53 may be formed of refractory metal(s) (e.g., cobalt, titanium, nickel, tungsten, and/or molybdenum). Further, the first metal layer 53 may be formed using a deposition process having a good step coverage property. For example, the first metal layer 53 using a chemical vapor deposition (CVD), an atomic layer deposition (ALD), or a physical vapor deposition (PVD) (e.g., sputtering). In other embodiments, an electroplating process may be performed to form the first metal layer 53 filling the contact holes 37.

In example embodiments, the first metal layer 53 may be formed of tungsten having a relatively high melting point and a low resistance. The tungsten layer for the first metal layer 53 may be formed using CVD or ALD to fill the contact holes 37 and the trenches 45. Alternatively, electroplating process may be performed to form the first metal layer 53 filling the contact holes 37 and the trenches 45.

When the first metal layer 53 is deposited in the contact holes 37, a seam or void may be formed in the contact holes 37. However, according to example embodiments of the inventive concept, due to the increase in the upper width of contact holes 37, it is possible to suppress the void or seam from occurring when the first metal layer 53 is deposited in the contact holes 37. In example embodiments, the first metal layer 53 may be formed to fill fully the contact holes 37 provided with the first barrier metal layer 51.

Figure 6:
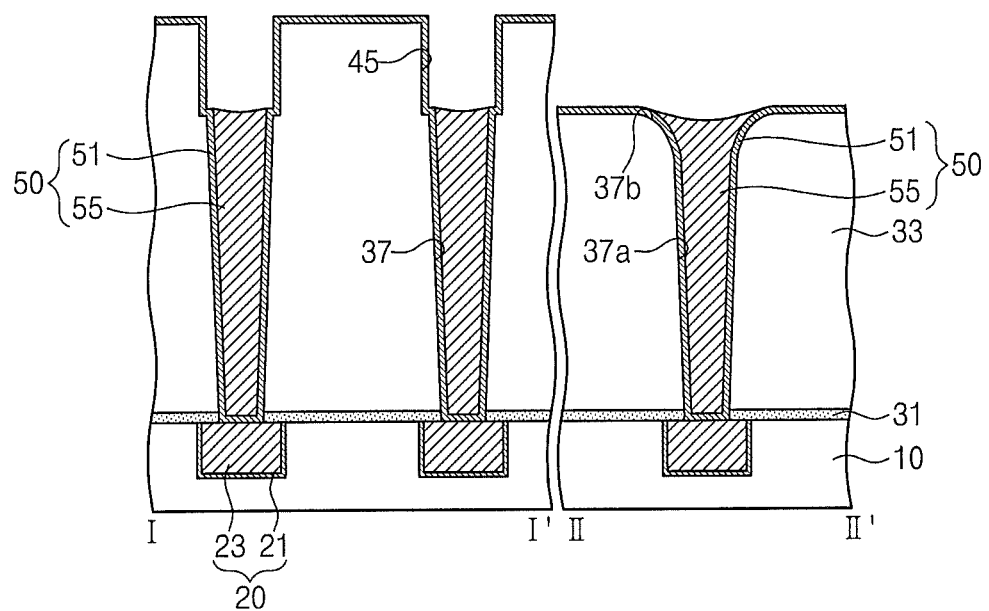

Referring to FIGS. 1 and 6, a portion of the first metal layer 53 may be removed from the trenches 45 to expose the first barrier metal layer 51 through bottom surfaces of the trenches 45. Accordingly, conductive metal plugs 55 may be formed in the contact holes 37, respectively.

For example, an anisotropic etching process may be performed to remove the first metal layer 53 from the trenches 45. In example embodiments, the anisotropic etching process may be performed to expose the first barrier metal layer 51 on the bottom surfaces of the trenches 45. In example embodiments, the metal plugs 55 may be formed to have top surfaces that are substantially coplanar with or lower than the bottom surfaces of the trenches 45. In the case where the first metal layer 53 is made of tungsten, a radio-frequency (RF) etching process using argon gas may be used to etch the first metal layer 53. After the formation of the contact plug 50, a cleaning process may be performed to remove by-products from the trenches 45.

In example embodiments, since the contact holes 37 are completely filled with the first metal layer 53, it is possible to reduce or prevent voids or seams in the contact holes 37 from being exposed when a portion of the first metal layer 53 is removed from the trenches 45. Further, since the contact holes 37 have an increased upper width, the metal plug 55 can have an increased upper area. This makes it possible to increase a contact area between it and an upper interconnection line to be formed in a subsequent process.

Figure 7:
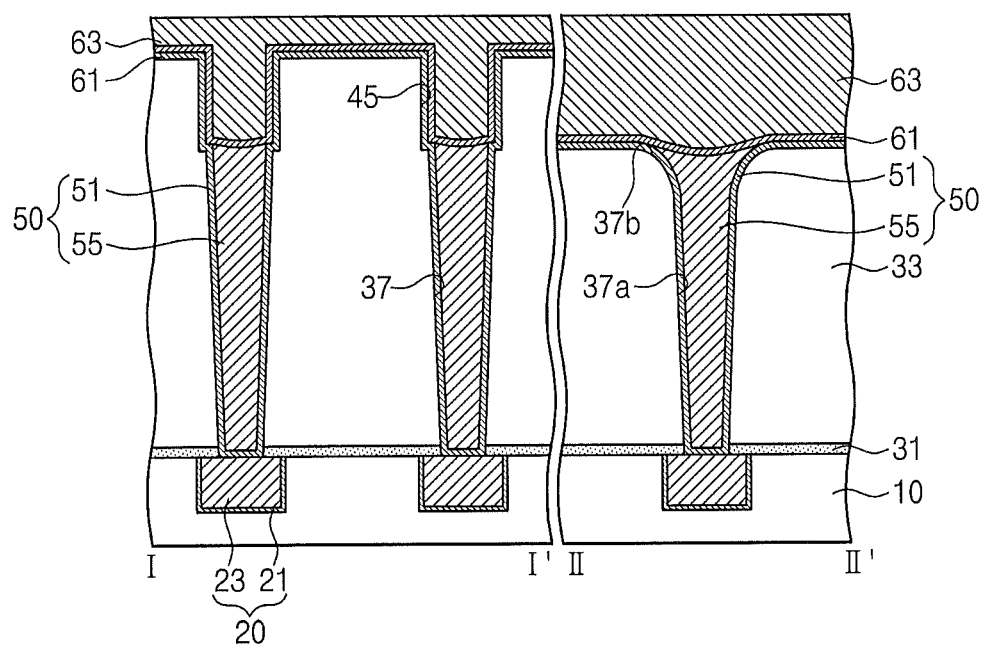

Referring to FIGS. 1 and 7, a second barrier metal layer 61 may be conformally deposited on the trenches 45. The second barrier metal layer 61 may be formed of a material capable of reducing or preventing a metallic material provided in the trenches 45 from being diffused into the interlayered dielectric layer 33. For example, the second barrier metal layer 61 may be formed of Ta, TaN, TaSiN, Ti, TiN, TiSiN, W, WN, or any combination thereof. The second barrier metal layer 61 may have a thickness of about 5 Å to 50 Å. The second barrier metal layer 61 may be formed using a chemical vapor deposition (CVD), an atomic layer deposition (ALD), and/or a physical vapor deposition (PVD) (e.g., sputtering).

In example embodiments, since the first barrier metal layer 51 is exposed through bottom surfaces of the trenches 45, the second barrier metal layer 61 may be in direct contact with the first barrier metal layer 51 at side and bottom surfaces of the trenches 45. In addition, the second barrier metal layer 61 may cover a top surface of the contact plug 50.

A second metal layer 63 may be formed to fill the trenches 45 with the second barrier metal layer 61. The second metal layer 63 may be formed of a metal material (e.g., copper (Cu) or copper alloy) that is different from the metal plug 55. Here, the copper alloy may be a material containing copper and C, Ag, Co, Ta, In, Sn, Zn, Mn, Ti, Mg, Cr, Ge, Sr, Pt, Mg, Al, and/or Zr.

The second metal layer 63 may be formed using an electroplating or electroless plating process. In the case where the second metal layer 63 is formed using the electroplating process, a seed layer may be formed on a surface of the second barrier metal layer 61. The seed layer may contribute to increase uniformity of the plating layer and serve as initial nucleation sites. The seed layer may be formed of Cu, Au, Ag, Pt, or Pd, and the material for the seed layer may be changed depending on a plating process and the second metal layer 63. The plating process makes it possible to form the second metal layer 63 that is filled from bottoms of the trenches 45.

Figure 8:
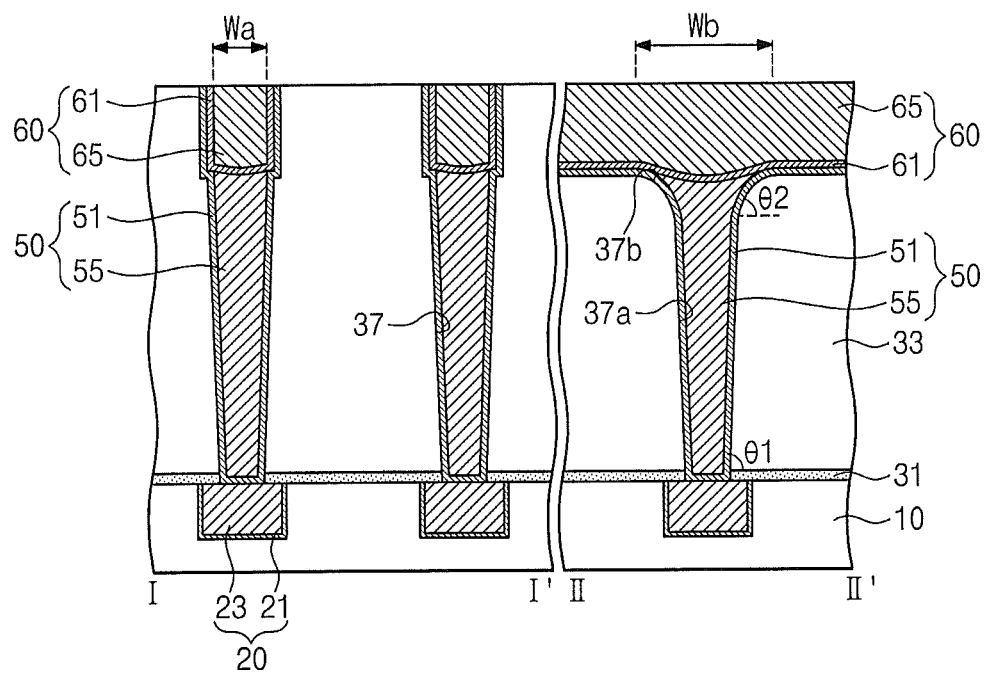

Referring to FIGS. 1 and 8, a planarization process may be performed to the second metal layer 63 and the first and second barrier metal layers 51 and 61, thereby forming upper conductive interconnection lines 60 in the trenches 45, respectively. A top surface of the interlayered dielectric layer 33 may be exposed as the result of the planarization process. In example embodiments, the planarization process may be performed using a chemical mechanical polishing (CMP) process.

As shown in FIGS. 1 and 8, the interconnection structure may include the lower interconnection 20, the upper conductive interconnection line 60, and the conductive contact plug 50 electrically connecting the lower interconnection 20 to the upper interconnection line 60.

In example embodiments, the contact plug 50 may include the first barrier metal layer 51 covering the inner walls of the contact holes 37 and the metal plug 55 filling the contact holes 37. The first barrier metal layer 51 may extend from the inner walls of the contact holes 37 to cover the side and bottom surfaces of the trenches 45. The metal plug 55 may have a top surface that is substantially coplanar with or lower than the bottom surfaces of the trenches 45.

In example embodiments, the contact plug 50 may be configured in such a way that lower and upper portions thereof have different sidewall slopes relative to the underlying layer 10. For example, the contact plug 50 may include the lower sidewall 37a slanted at the first angle θ1 relative to the underlying layer 10 and the upper sidewall 37b slanted at the second angle θ2 relative to the underlying layer 10, and the second angle θ2 may be smaller than the first angle θ1. For example, a sidewall profile of the contact plug 50 may have an inflection point. In example embodiments, the contact plug 50 may be formed in such a way that its width in the second direction D2 gradually increases with decreasing distance from the upper interconnection line 60. In plan view, the contact plug 50 may have the first upper width Wa in the first direction D1 and the second upper width Wb in the second direction D2, where the second upper width Wb may be greater than the first upper width. Wa. In example embodiments, the first upper width Wa of the contact plug 50 may be smaller than a width of the upper interconnection line 60. The second upper width Wb of the contact plug 50 may be greater than the width of the upper interconnection line 60. In the case where the contact plug 50 has the increased upper width, a contact area between the contact plug 50 and the upper interconnection line 60 can be increased and thus the interconnection structure can have improved electrical reliability.

In example embodiments, the upper interconnection line 60 may include a second barrier metal layer 61 covering an inner wall of the trench 45 and a top surface of the contact plug 50 and a second metal pattern 65 filling the trenches 45. The second barrier metal layer 61 may be in direct contact with the first barrier metal layer 51, at bottom and side surfaces of the trenches 45. The second metal pattern 65 may be formed of a different metal material from the metal plug 55. For example, the second metal pattern 65 may be formed of copper or copper alloy having high charge mobility and low resistance. According to the present embodiment, the trenches 45 may be fully filled with the second metal pattern 65. This makes it possible to reduce or prevent electrical characteristics of the upper interconnection line 60 from being deteriorated by a thinning of the second metal pattern 65.

In example embodiments, the upper interconnection lines 60 may be formed in a single insulating layer. For example, even in the case where the interlayered dielectric layer 33 includes a plurality of stacked insulating layers, the upper interconnection lines 60 may be spaced apart from an interface between the stacked insulating layers. Accordingly, it is possible to reduce or prevent the metal material of the upper interconnection line 60 from being moved along the interface between the stacked insulating layers, when the upper interconnection lines 60 are applied with a specific voltage (e.g., power voltage). That is, it is possible to reduce or prevent the likelihood of an electrical short circuit from occurring.

Figure 9:
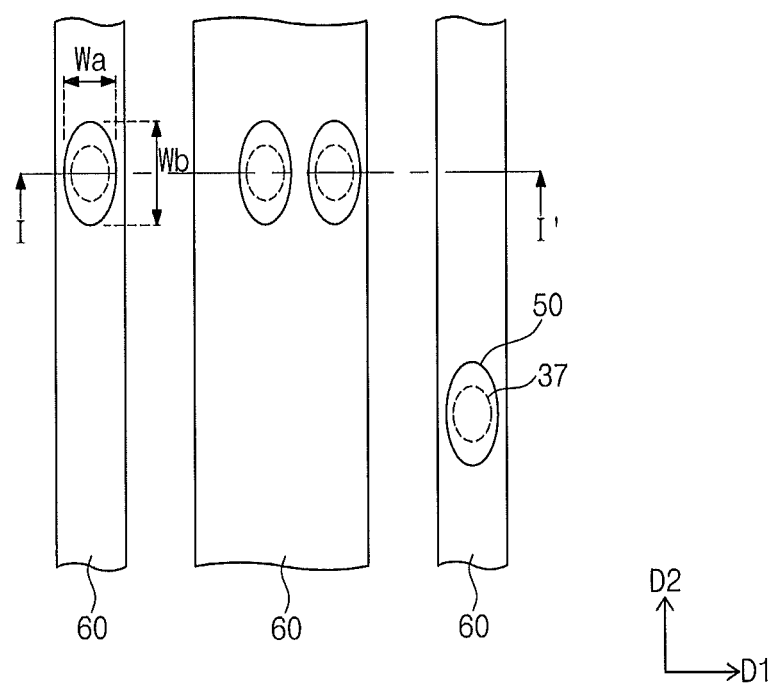
FIG. 9 is a plan view illustrating an interconnection structure of a semiconductor device according to some example embodiments of the inventive concept.

FIG. 9 is a plan view illustrating an interconnection structure of a semiconductor device according to other example embodiments of the inventive concept. FIGS. 10 through 16 are sectional views illustrating a method of forming an interconnection structure of a semiconductor device according to other example embodiments of the inventive concept. For example, FIGS. 10 through 16 are sectional views taken along a line III-III' of FIG. 9.

For conciseness, previously described elements may be identified by a similar or identical reference numbers without repeating an overlapping description thereof. According to the present embodiment, the interconnection structure may include upper interconnection lines 60 having different widths from each other.

Figure 10:
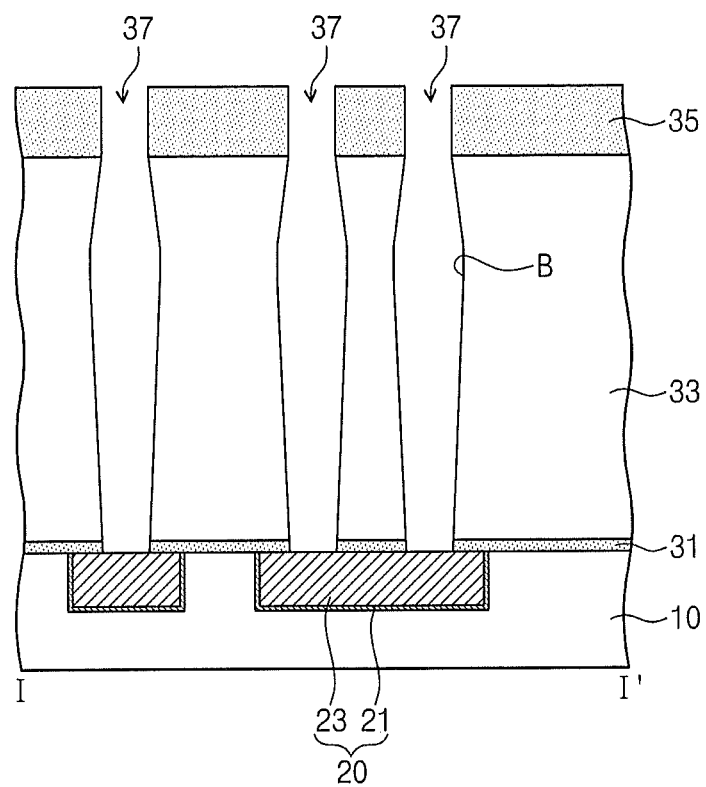
FIGS. 10 through 16 are sectional views illustrating a method of forming an interconnection structure of a semiconductor device according to some example embodiments of the inventive concept.

Referring to FIGS. 9 and 10, the lower interlayered dielectric layer 33 with the contact holes 37 may be formed on the underlying layer 10 with the lower interconnections 20. As described in the previous embodiments, the underlying layer 10 may include a semiconductor substrate and semiconductor devices (e.g., MOS transistors, capacitor, and resistor) provided on the semiconductor substrate, and the semiconductor devices may be electrically connected to the lower interconnections 20.

As described with reference to FIG. 2, the formation of the contact holes 37 in the lower interlayered dielectric layer 33 may include forming the first mask pattern 35, and anisotropically etching the lower interlayered dielectric layer 33 using the first mask pattern 35 as an etch mask. The first mask pattern 35 may be removed after the formation of the contact holes 37.

The contact holes 37 may be formed to expose portions of the lower interconnections 20, and positions of the contact holes 37 may be changed depending on an interconnection design of the semiconductor device. In example embodiments, each of the contact holes 37 may be formed to have a high aspect ratio of about 1:5 to 1:20. The formation of the contact holes 37 with high aspect ratio may lead to a bowing effect. For example, during the anisotropic etching process of the lower interlayered dielectric layer 33, an ionized etching gas may be scattered by the first mask pattern 35 and be concentrated on a portion of an inner sidewall of the contact hole 37, thereby resulting in the bowing effect. An increase in thickness of the lower interlayered dielectric layer 33 or in aspect ratio of the contact holes 37 may deepen the bowing effect. For example, the higher the aspect ratio of the contact holes 37 the larger the bowing region B. According to the present embodiment, a lower width of the contact hole 37 may be smaller than an upper width thereof, and the width of the contact hole 37 at the bowing region B may be greater than both of the upper and lower widths of the contact hole 37.

The bowing region B may result in a formation of void or seam in the contact holes 37, when a metal material is deposited on the structure with the contact holes 37. According to example embodiments of the inventive concept, before the deposition of the metal material, a process of enlarging upper portions of the contact holes 37 may be performed to suppress void or seam from occurring.

Figure 11:
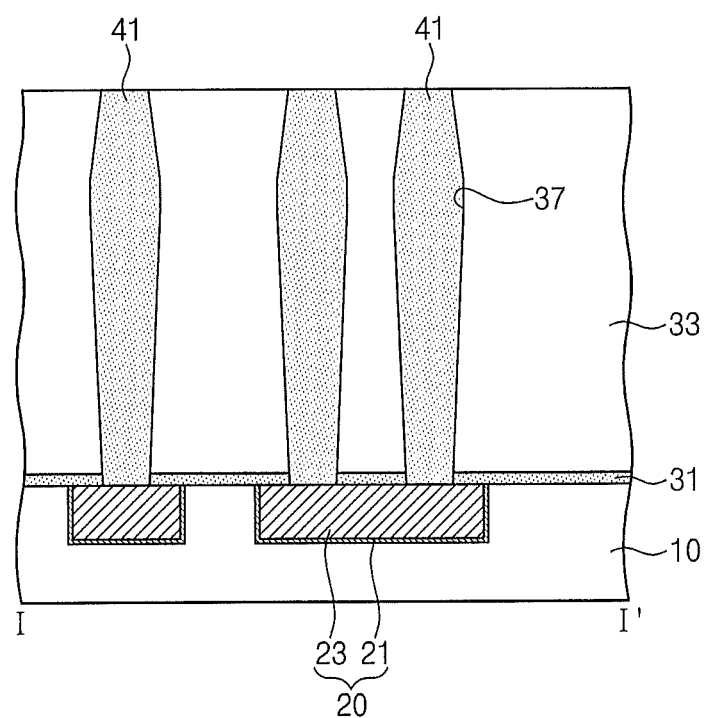

Referring to FIG. 11, after the formation of the contact holes 37, the sacrificial layer 41 may be formed to fill the contact holes 37. The sacrificial layer 41 may be formed of a material having an etch selectivity with respect to the lower interlayered dielectric layer 33, as described with reference to FIG. 3. The sacrificial layer 41 may be formed using a spin coating process and thereby the contact holes 37 with high aspect ratio can be completely filled with the sacrificial layer 41. After the coating of the sacrificial layer 41, a planarization process may be performed on the sacrificial layer 41 to expose a top surface of the lower interlayered dielectric layer 33.

The sacrificial layer 41 may be formed of, for example, a spin-on-hardmask (SOH) layer or an amorphous carbon layer (ACL). The SOH layer may include a carbon-based SOH layer or a silicon-based SOH layer. In other embodiments, the sacrificial layer 41 may be formed of a photoresist layer or an amorphous silicon layer.

Figure 12:
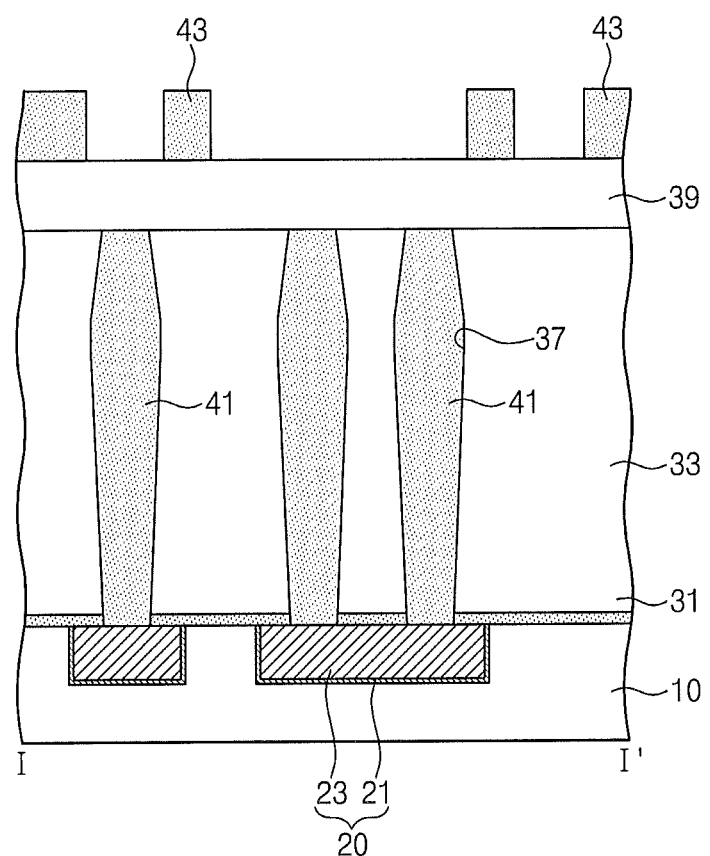

Next, as shown in FIG. 12, an upper interlayered dielectric layer 39 may be formed on the sacrificial layer 41 and the lower interlayered dielectric layer 33. The upper interlayered dielectric layer 39 may be formed to have a single-layered structure or a multi-layered structure including a plurality of layers. The upper interlayered dielectric layer 39 may be thinner than the lower interlayered dielectric layer 33. For example, a thickness of the upper interlayered dielectric layer 39 may range from about ½ to about ⅕ of that of the lower interlayered dielectric layer 33.

Next, the second mask pattern 43 for defining trenches may be formed on the upper interlayered dielectric layer 39. The second mask pattern 43 may be formed to have a line-and-space structure. For example, the second mask pattern 43 may include line-shaped patterns that are spaced apart from each other in a first direction D1 and are elongated along the second direction D2. According to the present embodiment, the second mask pattern 43 may be formed to define line-shaped openings having at least two different widths.

Figure 13:
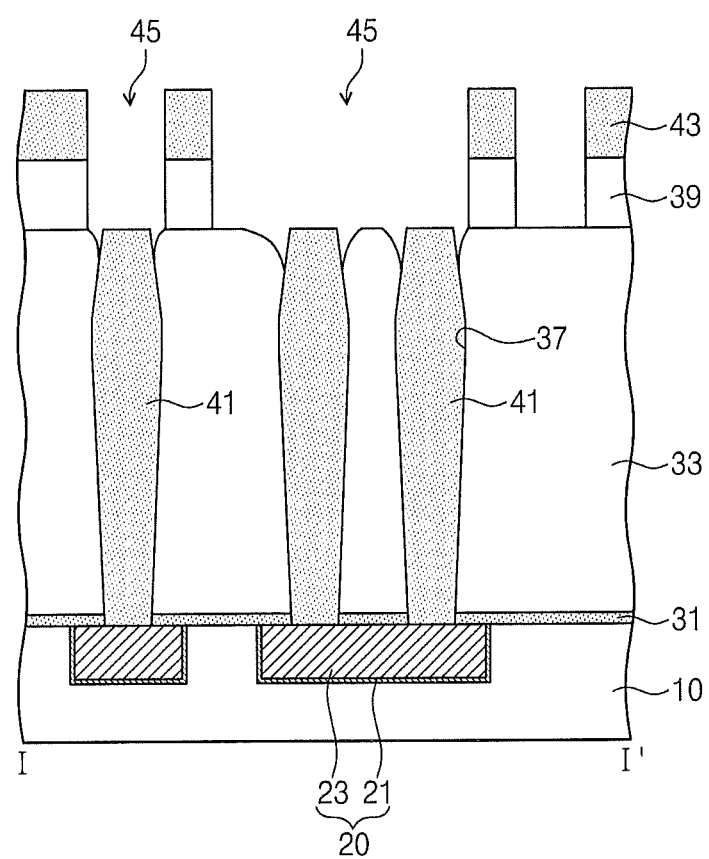

Referring to FIGS. 9 and 13, the upper interlayered dielectric layer 39 may be anisotropically etched, using the second mask pattern 43 as an etch mask, to form the trenches 45. The trenches 45 may be spaced apart from each other in the first direction D1 and be elongated along the second direction D2. According to the present embodiment, the trenches 45 may be formed to expose partially a top surface of the lower interlayered dielectric layer 33. For example, the bottom surfaces of the trenches 45 may be partially defined by the top surface of the lower interlayered dielectric layer 33. Further, according to the present embodiment, the trenches 45 may have two different widths. For example, at least one of the trenches 45 (for example, wide trench) may be formed to expose top surfaces of a plurality of the sacrificial layers 41.

During the anisotropic etching process for forming the trenches 45, sidewalls of the contact holes 37 in contact with the sacrificial layer 41 may be recessed or etched along a longitudinal direction of the trenches 45 or the second direction D2. For the wide trench, the sidewall of the contact hole 37 in contact with the sacrificial layer 41 may be recessed or etched in the first direction D1. In other words, the contact holes 37 may have a changed upper sidewall profile (e.g., an increased upper width). Accordingly, a sidewall slope of the contact hole 37 relative to the underlying layer 10 may differ between lower and upper portions thereof. For example, as described with reference to FIG. 4, the contact hole 37 may include a lower sidewall slanted at a first angle relative to the underlying layer 10 and an upper sidewall slanted at a second angle relative to the underlying layer 10, and the second angle may be smaller than the first angle. According to example embodiments of the inventive concept, the upper width, in plan view, of the contact holes 37 may be greater in the second direction D2 than in the first direction D1. Further, the upper width of the contact hole 37 in the second direction D2 may be greater than a width of the bowing region B of the contact hole 37.

According to example embodiments of the inventive concept, the width of the trench 45 in the first direction D1 may be greater than about two times the upper width of the contact hole 37, and in this case, the upper width of the contact hole 37 in the first direction D1 may be increased with increasing the upper width of the contact hole 37 in the first direction D2.

Figure 14:
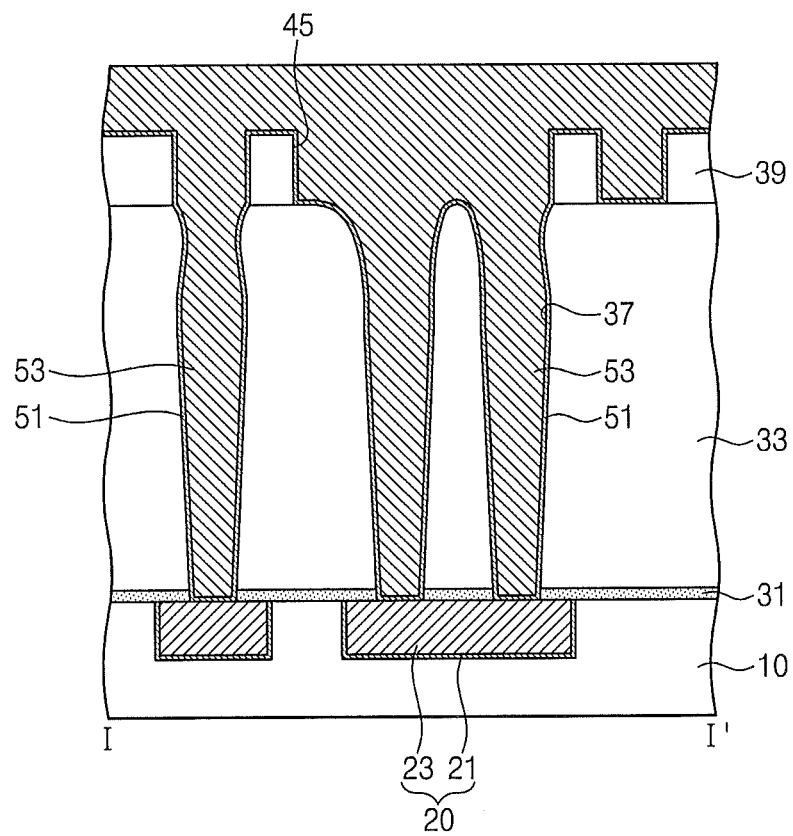

Referring to FIG. 14, the second mask pattern 43 and the sacrificial layer 41 may be removed after the formation of the trenches 45. For example, the second mask pattern 43 and the sacrificial layer 41 may be removed, at substantially the same time, by an ashing process or a wet cleaning process.

Still referring to FIG. 14, as described with reference to FIG. 5, the first barrier metal layer 51 and the first metal layer 53 may be sequentially formed to fill the contact holes 37 and the trenches 45. The first barrier metal layer 51 may be formed to cover inner walls of the contact holes 37 and the trenches 45 and a top surface of the upper interlayered dielectric layer 39 with a uniform thickness. In example embodiments, the first barrier metal layer 51 may be formed of Ta, TaN, TaSiN, Ti, TiN, TiSiN, W, WN, or any combination thereof. The first barrier metal layer 51 may have a thickness of about 5 Å to 50 Å. The first metal layer 53 may be formed of refractory metal(s) (e.g., cobalt, titanium, nickel, tungsten, and/or molybdenum). For example, the first metal layer 53 may be formed of tungsten having a relatively high melting point and a low resistance. The first barrier metal layer 51 and the first metal layer 53 may be formed using a deposition process capable of providing a good step coverage property.

Figure 15:
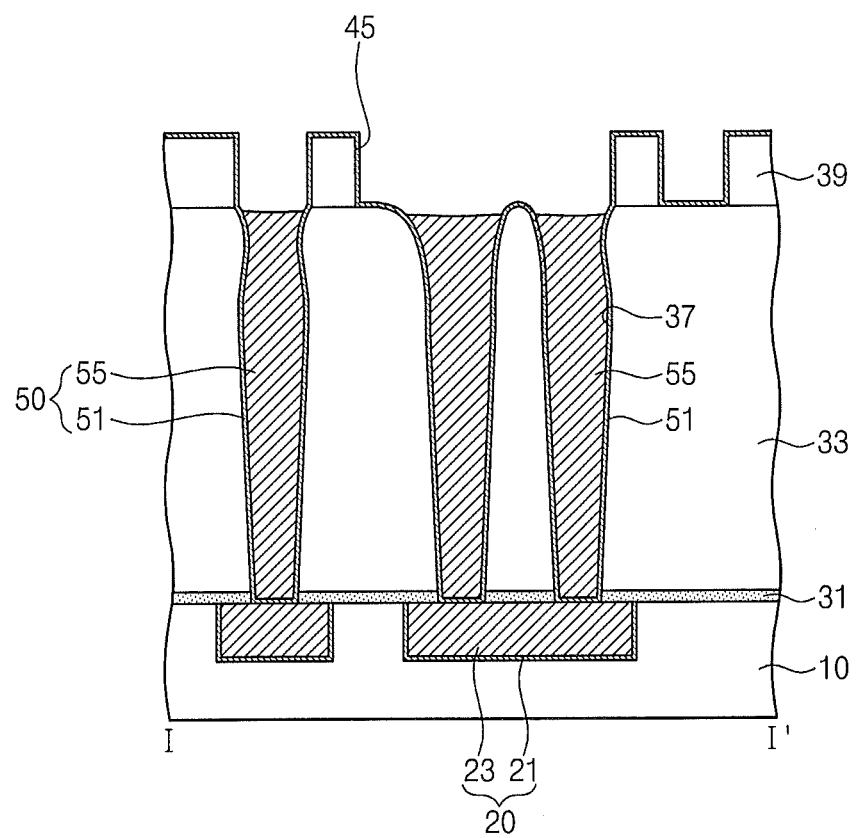

Referring to FIG. 15, a portion of the first metal layer 53 may be removed to form the metal plugs 55 localized in the contact holes 37. As described with reference to FIG. 6, an anisotropic etching process may be performed to the first metal layer 53 to remove the first metal layer 53 from the trenches 45. The anisotropic etching process may be performed until the first barrier metal layer 51 is exposed through the bottom surfaces of the trenches 45.

Figure 16:
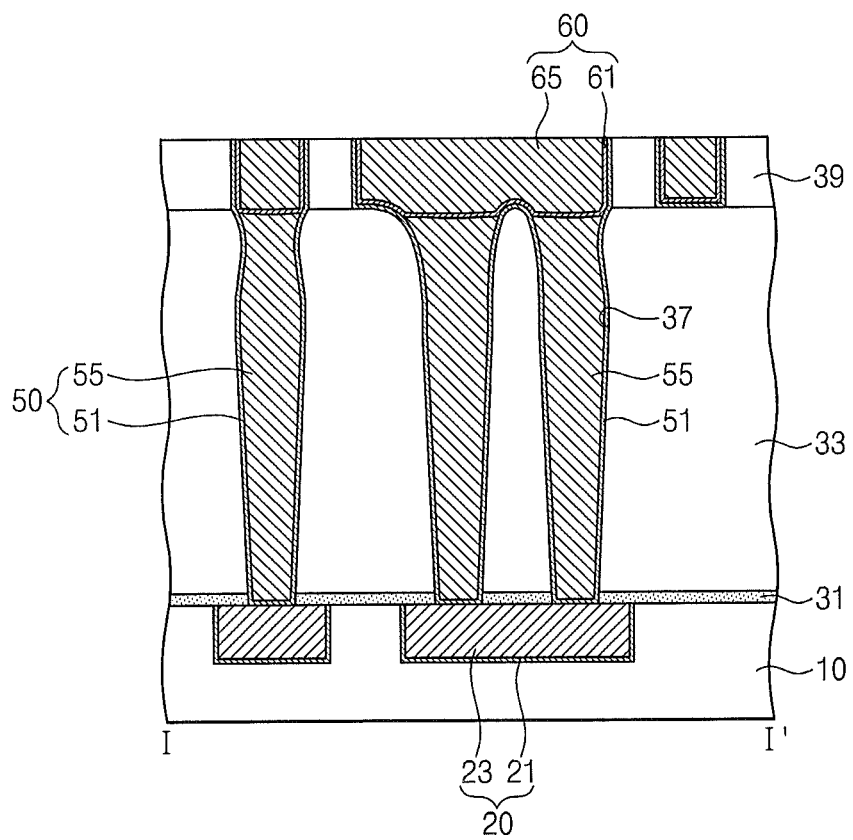

Referring to FIG. 16, the second barrier metal layer 61 and the second metal layer 63 may be sequentially formed to fill the trenches 45 and cover the first barrier metal layer 51. The second barrier metal layer 61 may be formed using a deposition process, thereby conformally covering the first barrier metal layer 51 and the metal plugs 55. The second metal layer 63 may be formed using a plating process, thereby filling the trenches 45 upward from the bottom.

As described above, the second barrier metal layer 61 may be in direct contact with the first barrier metal layer 51 at side and bottom of the trenches 45. The second barrier metal layer 61 may cover a top surface of the metal plug 55. In example embodiments, the second barrier metal layer 61 may be formed of Ta, TaN, TaSiN, Ti, TiN, TiSiN, W, WN, or any combination thereof. Thereafter, a planarization process may be performed to the second metal layer 63 to form the upper interconnection lines 60 that are localized within the trenches 45, respectively.

Hereinafter, a method of fabricating a data storing element will be described with reference to FIGS. 17 through 25. The methods of forming the interconnection structure, according to example embodiments of the inventive concept as described above, may be applied to fabricate the data storing element.

Figure 17:
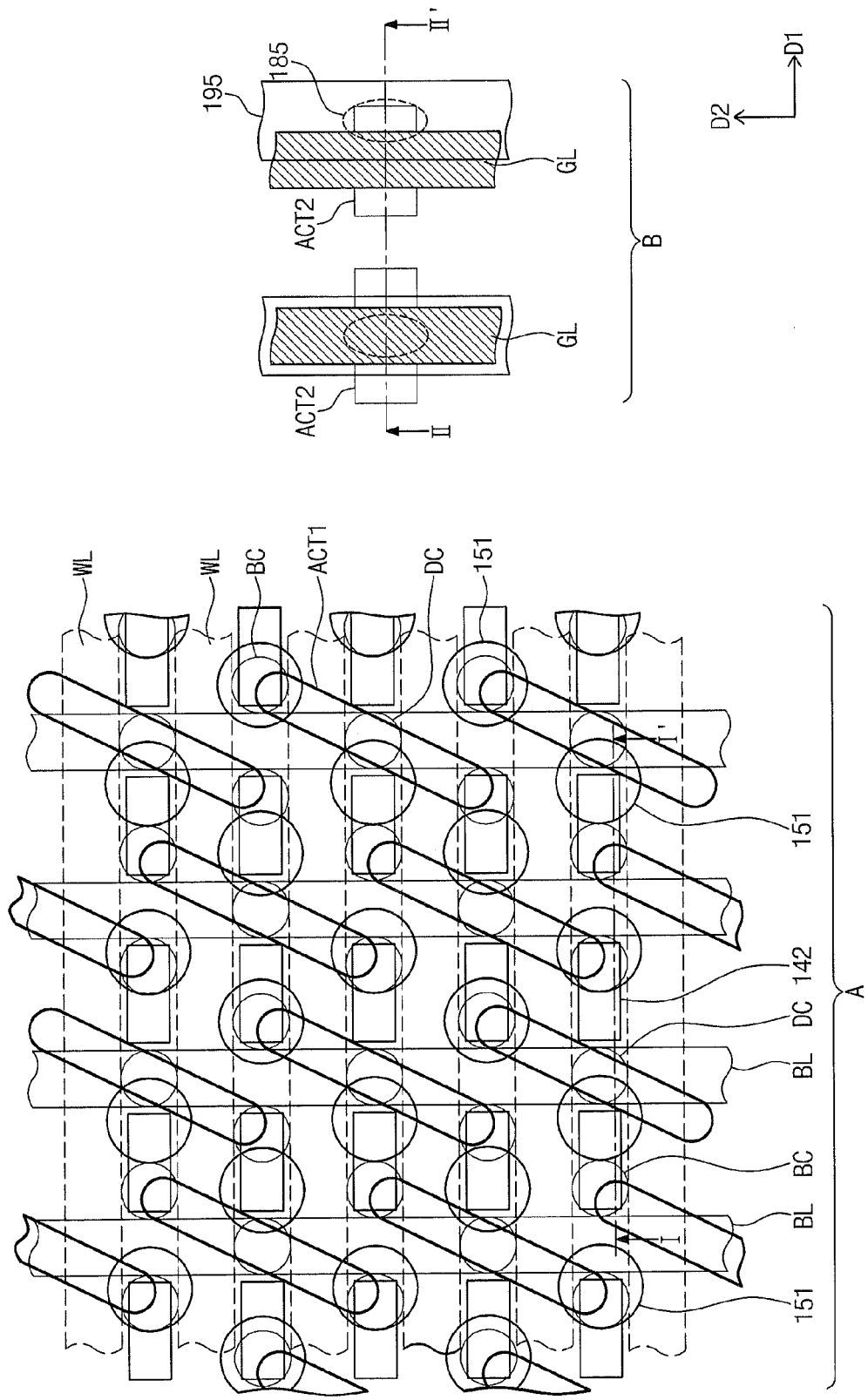
FIG. 17 is a plan view illustrating a data storing element of a semiconductor device according to some example embodiments of the inventive concept.

FIG. 17 is a plan view illustrating a data storing element of a semiconductor device according to example embodiments of the inventive concept. FIGS. 18 through 25 are sectional views illustrating a method of forming a data storing element according to example embodiments of the inventive concept. In particular, FIGS. 18 through 25 are sectional views taken along lines I-I' and II-II' of FIG. 18.

Figure 18:
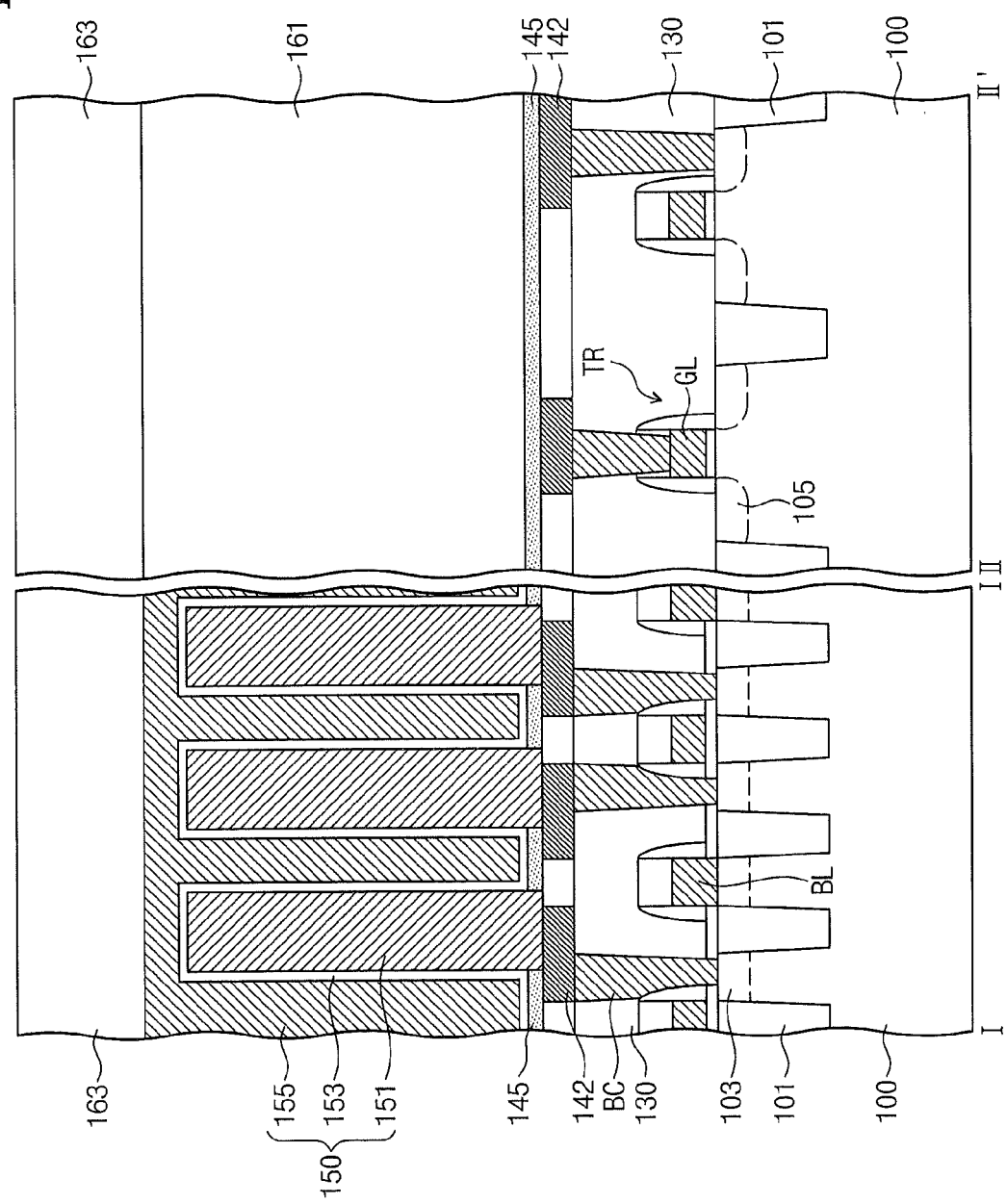

Referring to FIGS. 17 and 18, the semiconductor substrate 100 may include a cell region A to be formed with memory cells and a peripheral circuit region B to be formed with peripheral circuits controlling the memory cells. Each of the memory cells on the cell region A may include a selection device and a data storing element. For example, the selection device may be a MOS transistor or diode. The data storing element may be a capacitor, a variable resistor, and so forth. The peripheral circuits TR (e.g., NMOS and PMOS transistors, diodes, or resistors) may be formed on the peripheral circuit region B to control the memory cells.

In example embodiments, word lines WL and bit lines BL may be provided on the cell region A of the semiconductor substrate 100 to cross each other, and each of the data storing elements may be formed at a corresponding one of the intersections between the word and bit lines WL and BL. In example embodiments, the data storing element may include or be a capacitor 150 including a lower electrode 151, an upper electrode 155, and a dielectric 153 interposed therebetween.

For example, a device isolation layer 101 may be formed on the cell region A of the semiconductor substrate 100 to define active regions ACT1. Here, the active regions ACT1 may be shaped like a bar, whose longitudinal axis is at a non-perpendicular angle to the word lines WL and the bit lines BL.

The word lines WL may be provided to cross the active regions ACT1. In example embodiments, the word lines WL may be provided in recess regions, which are recessed by a predetermined depth from a surface of the cell region A of the semiconductor substrate 100, with a gate insulating layer interposed therebetween. Source/drain regions 103 may be formed in portions of the active regions ACT1 at both sides of each word line WL. The source/drain regions 103 may be doped with impurities. The word lines WL and the source/drain regions 103 may constitute or define a plurality of MOS transistors that are formed on the cell region A of the semiconductor substrate 100.

The bit lines BL may be provided on the cell region A of the semiconductor substrate 100 to cross the word lines WL. The bit lines BL may be electrically connected to the source/drain regions 103.

The contact plugs BC may be formed through a first interlayered dielectric layer 130 covering the bit lines BL to electrically connect the data storing element to the source/drain regions 103. In example embodiments, the contact plugs BC may be provided on portions of the active region ACT1 at both sides of the bit line BL. The formation of the contact plugs BC may include forming contact holes in the first interlayered dielectric layer 130 to expose the source/drain regions 103, depositing a conductive layer on the first interlayered dielectric layer 130 to fill the contact hole, and then, planarizing the conductive layer. The contact plug BC may be formed of a doped polysilicon layer, a metal layer, a metal nitride layer, and/or a metal silicide layer.

In example embodiments, contact pads 142 may be formed on the contact plugs BC, respectively. The contact pads 142 may be two-dimensionally arranged on the first interlayered dielectric layer 130 to increase contact areas between the lower electrodes of the capacitors 150 and the contact plugs BC. A pair of the contact pads 142 disposed adjacent to each other may be expanded toward opposite directions or outward from the bit line BL interposed therebetween.

The lower electrodes 151 of the capacitors 150 may be formed on the contact pads 142, respectively. After the formation of the lower electrode 151, the dielectric 153 may be formed to cover conformally the lower electrode 151, and the upper electrode 155 may be formed on the dielectric 153. In example embodiments, as shown in FIG. 18, the lower electrode 151 may be shaped like a pillar. Here, a width of the lower electrode 151 may decrease from top to bottom. For example, the lower width of the lower electrode 151 may be smaller than the upper width of the lower electrode 151. Alternatively, the lower electrode 151 may be shaped like a cylinder having a bottom portion and a sidewall portion vertically extending from the bottom portion, as shown in FIG. 25. In example embodiments, the bottom and sidewall portions of the lower electrode 151 may have substantially the same thickness.

The lower electrode 151 may be formed of metals, metal nitrides, and/or metal silicides. For example, the lower electrode 151 may be formed of one or more refractory metals (e.g., cobalt, titanium, nickel, tungsten, and/or molybdenum). In other embodiments, the lower electrode 151 may be formed of metal nitrides (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and/or tungsten nitride (WN)). In still other embodiments, the lower electrode 151 may be formed of noble metals (e.g., platinum (Pt), ruthenium (Ru), and/or iridium (Ir)). In even other embodiments, the lower electrode 151 may be formed of a conductive noble metal oxide (e.g., PtO, $RuO_2$, or $IrO_2$) and/or a conductive oxide (e.g., SRO ($SrRuO_3$), BSRO (($Ba,Sr)RuO_3$), CRO ($CaRuO_3$), or LSCo).

The dielectric 153 may be formed to cover a plurality of the lower electrodes 151 with a substantially uniform thickness. The dielectric 153 may be formed of at least one selected from the group consisting of metal oxides (e.g., $HfO_2$, $ZrO_2$, $Al_2O_3$, $La_2O_3$, $Ta_2O_3$ and/or $TiO_2$) and perovskite dielectric materials (e.g., STO ($SrTiO_3$), BST (($Ba,Sr)TiO_3$), $BaTiO_3$, PZT, and/or PLZT). The dielectric 153 may have a thickness of about 50 Å-150 Å.

The upper electrode 155 may be formed on the dielectric 153 to cover the plurality of the lower electrodes 151. The upper electrode 155 may be formed to fill an inner space of the cylindrical lower electrode 151 provided with the dielectric 153. The upper electrode 155 may include doped silicon, metal materials, metal nitrides, and/or metal silicides. For example, the upper electrode 155 may be formed of one or more refractory metals (e.g., cobalt, titanium, nickel, tungsten, and/or molybdenum). In other embodiments, the upper electrode 155 may be formed of metal nitrides (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and/or tungsten nitride (WN)). In still other embodiments, the upper electrode 155 may be formed of noble metals (e.g., platinum (Pt), ruthenium (Ru), and/or iridium (Ir)). In even other embodiments, the upper electrode 155 may be formed of a conductive noble metal oxide (e.g., PtO, $RuO_2$, or $IrO_2$) and/or a conductive oxide (e.g., SRO ($SrRuO_3$), BSRO (($Ba,Sr)RuO_3$), CRO ($CaRuO_3$), or LSCo).

Next, referring to FIGS. 17 and 18, MOS transistors TR may be formed on the peripheral circuit region B of the semiconductor substrate 100. For example, on the peripheral circuit region B of the semiconductor substrate 100, the device isolation layer 101 may be formed to define peripheral active regions ACT2, and gate electrodes GL may be formed to cross the peripheral active regions ACT2, and impurity regions 105 may be formed in the peripheral active regions ACT2 at both sides of the gate electrodes GL. Contact plugs may be connected to the impurity regions 105 and the gate electrode GL.

The first interlayered dielectric layer 130 may extend from the cell region A to cover the MOS transistors TR on the peripheral circuit region B. A second interlayered dielectric layer 161 may be formed on the first interlayered dielectric layer 130 (e.g., on the peripheral circuit region B), and an etch stop layer 145 may be interposed between the second interlayered dielectric layer 161 and the contact pads 142. The second interlayered dielectric layer 161 may be formed to be coplanar with a top surface of the upper electrode 155 of the cell region A. A third interlayered dielectric layer 163 may be formed to cover the capacitor 150 of the cell region A and the second interlayered dielectric layer 161 of the peripheral circuit region B. The second and third interlayered dielectric layers 161 and 163 may include a low-k dielectric material (e.g., Flowable Oxide (FOX), Tonen SilaZene (TOSZ), Undoped Silica Glass (USG), Borosilicate Glass (BSG), PhosphoSilicate Glass (PSG), BoroPhosphoSilicate Glass (BPSG), Plasma Enhanced Tetra Ethyl Ortho Silicate (PETEOS), Fluoride Silicate Glass (FSG), high density plasma (HDP) oxide, Plasma Enhanced Oxide (PEOX), or any combination thereof).

Since a capacitance of the capacitor is proportional to an area of the lower electrode 151, a thickness of the lower electrode 151 may be increased in order to increase the area of the lower electrode 151 under a limitation on (e.g., when constrained by) an occupying area of the lower electrode 151. This means that such an increase in capacitance of the capacitor 150 may lead to an increase in aspect ratio (ratio of the height/thickness to width) of the lower electrode 151. Further, such an increase in thickness of the lower electrode 151 may lead to an increase in thickness of the second interlayered dielectric layer 161. Accordingly, the interconnection structure connected to the MOS transistors TR may include the contact plug having high aspect ratio, in order to contact the transistors TR through the relatively thick second interlayered dielectric layer 161.

Figure 19:
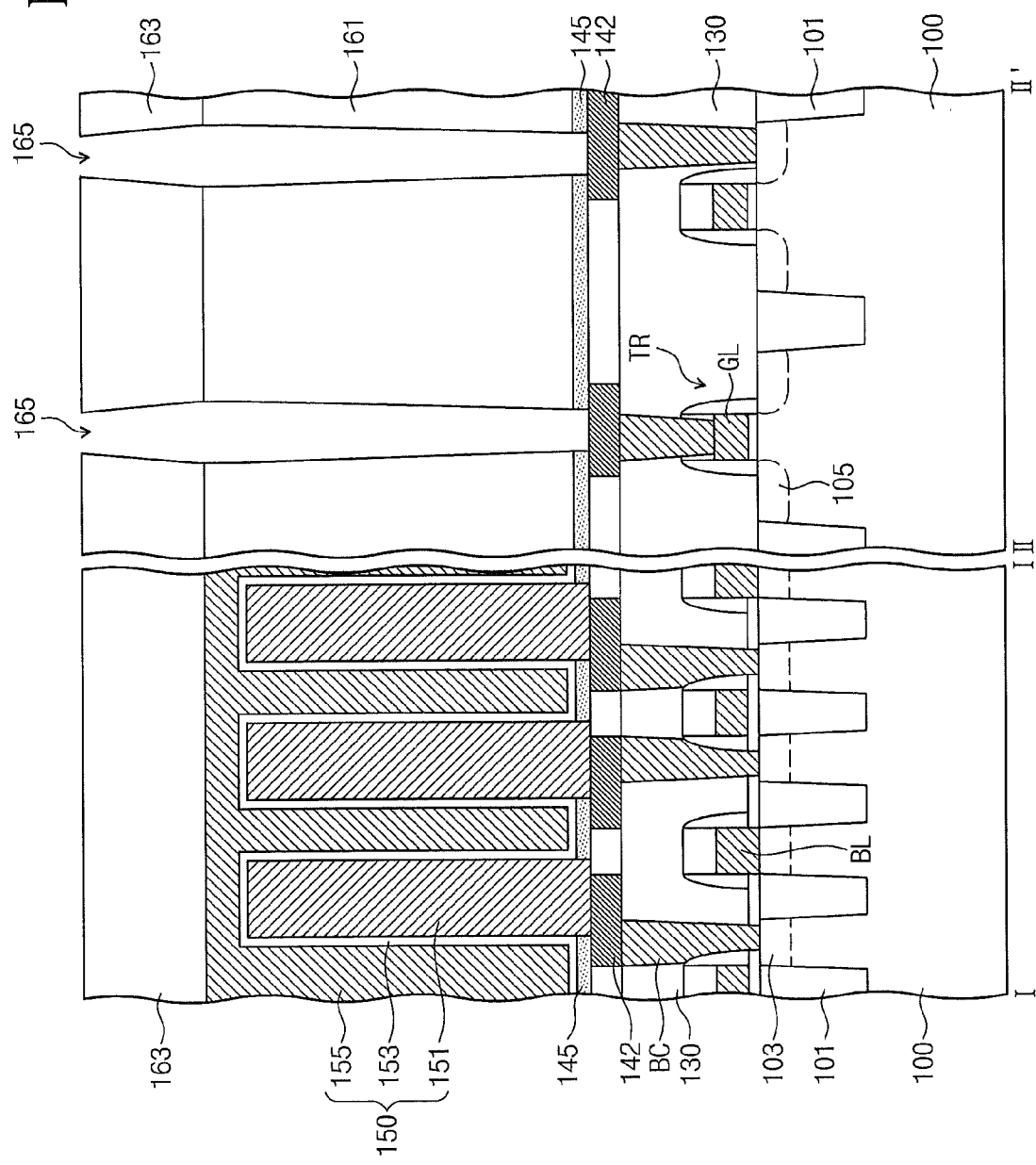

Referring to FIGS. 17 and 19, after the formation of the third interlayered dielectric layer 163 on the cell region A and the peripheral circuit region B, contact holes 165 may be formed on the peripheral circuit region B to penetrate and extend through the second and third interlayered dielectric layers 161 and 163 and expose the contact pads 142. The formation of the contact holes 165 may include forming a first mask pattern, and anisotropically etching the second interlayered dielectric layer 161 using the first mask pattern as an etch mask, as described with reference to FIG. 2.

According to the present embodiment, thickness and height of the contact holes 165 may be greater than those of the capacitor 150. The contact holes 165 may be formed to have a high aspect ratio of about 1:5 to 1:20. In the case where the contact holes 165 have a high aspect ratio, the contact holes 165 may include a bowing region B having an increased inner width, as described with reference to FIG. 10. Here, in plan view, the contact holes 165 may have a circular shape.

As shown in FIG. 25, contact holes may be formed on the cell region A, when the contact holes 165 are formed on the peripheral circuit region B. The contact hole on the cell region A may be shorter than the contact holes 165 on the peripheral circuit region B in terms of vertical thickness.

Figure 20:
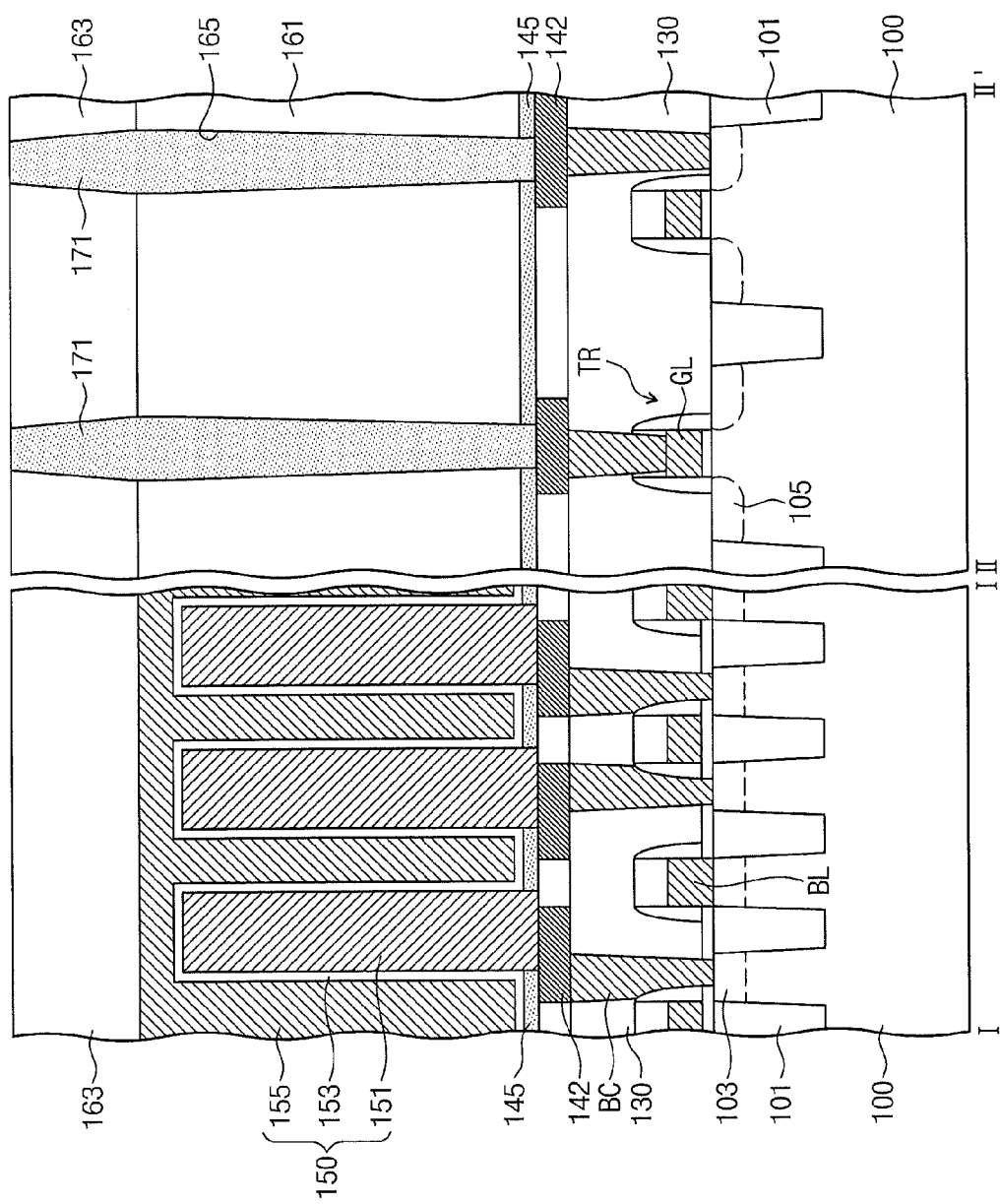

Referring to FIG. 20, a sacrificial layer 171 may be formed to fill the contact holes 165. The sacrificial layer 171 may be formed of a material having an etch selectivity with respect to the second interlayered dielectric layer 161, as described with reference to FIG. 3. The sacrificial layer 171 may be formed using a spin-coating process and thereby fill wholly the contact holes 165. Thereafter, a planarization process may be performed on the sacrificial layer 171 to expose a top surface of the third interlayered dielectric layer 163.

Figure 21:
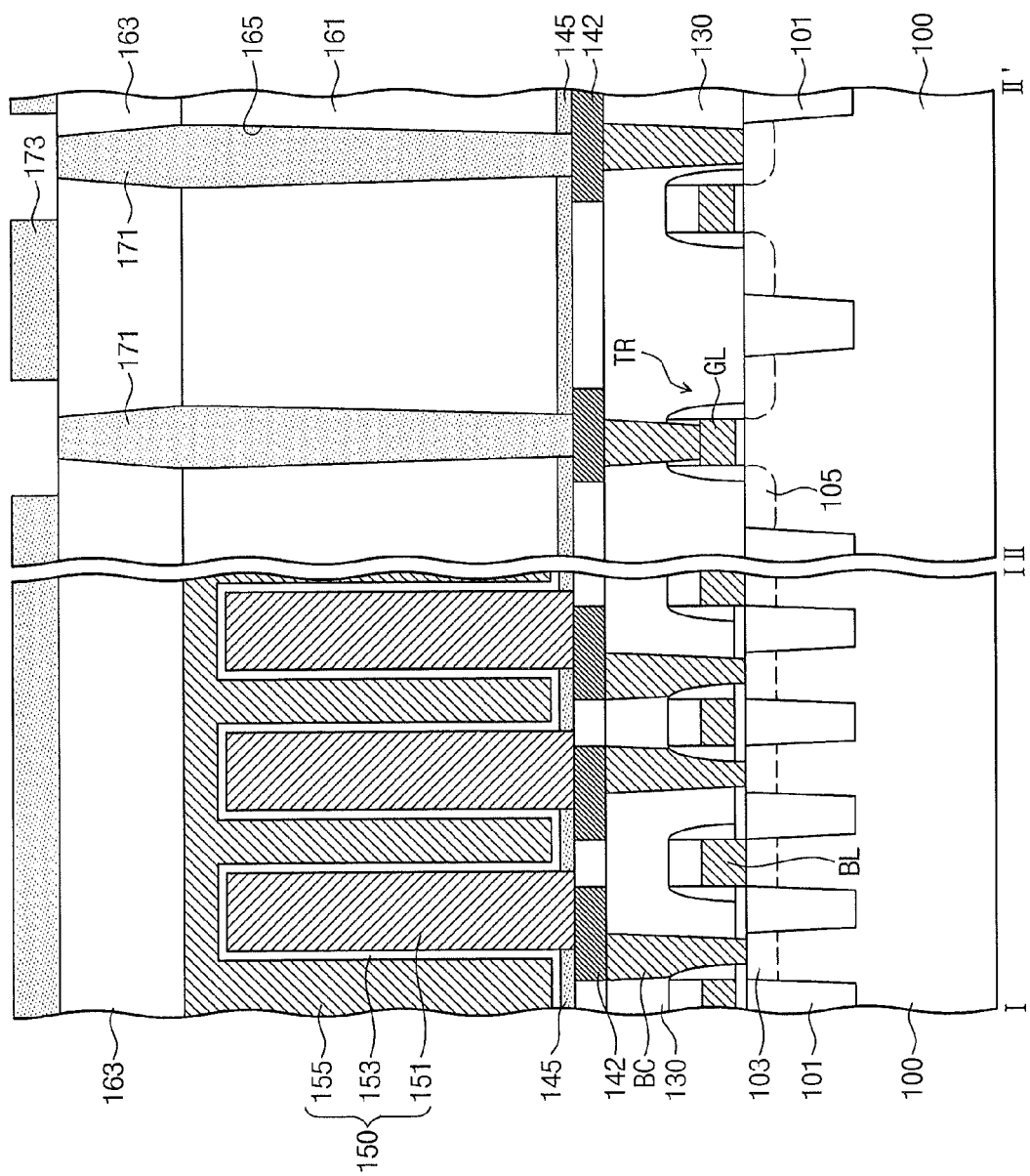

Referring to FIG. 21, a second mask pattern 173 may be formed on the third interlayered dielectric layer 163 to form trenches. As described with reference to FIG. 3, the second mask pattern 173 may be spaced apart from each other in the first direction D1 and be elongated along the second direction D2 crossing the first direction D1. The second mask pattern may be formed to expose a top surface of the sacrificial layer 171 provided in the contact holes 165.

The second mask pattern 173 may be formed of a material that can be etched by an etching gas for etching the sacrificial layer 171. The second mask pattern 173 may be formed to have an etch selectivity of about 1:1 to 1:2, in a process of etching the sacrificial layer 171. This means that the second mask pattern 173 and the sacrificial layer 171 may be etched together. In example embodiments, the second mask pattern 173 may be formed of a photoresist layer, a spin-on-hardmask (SOH) layer, or an amorphous carbon layer.

Figure 22:
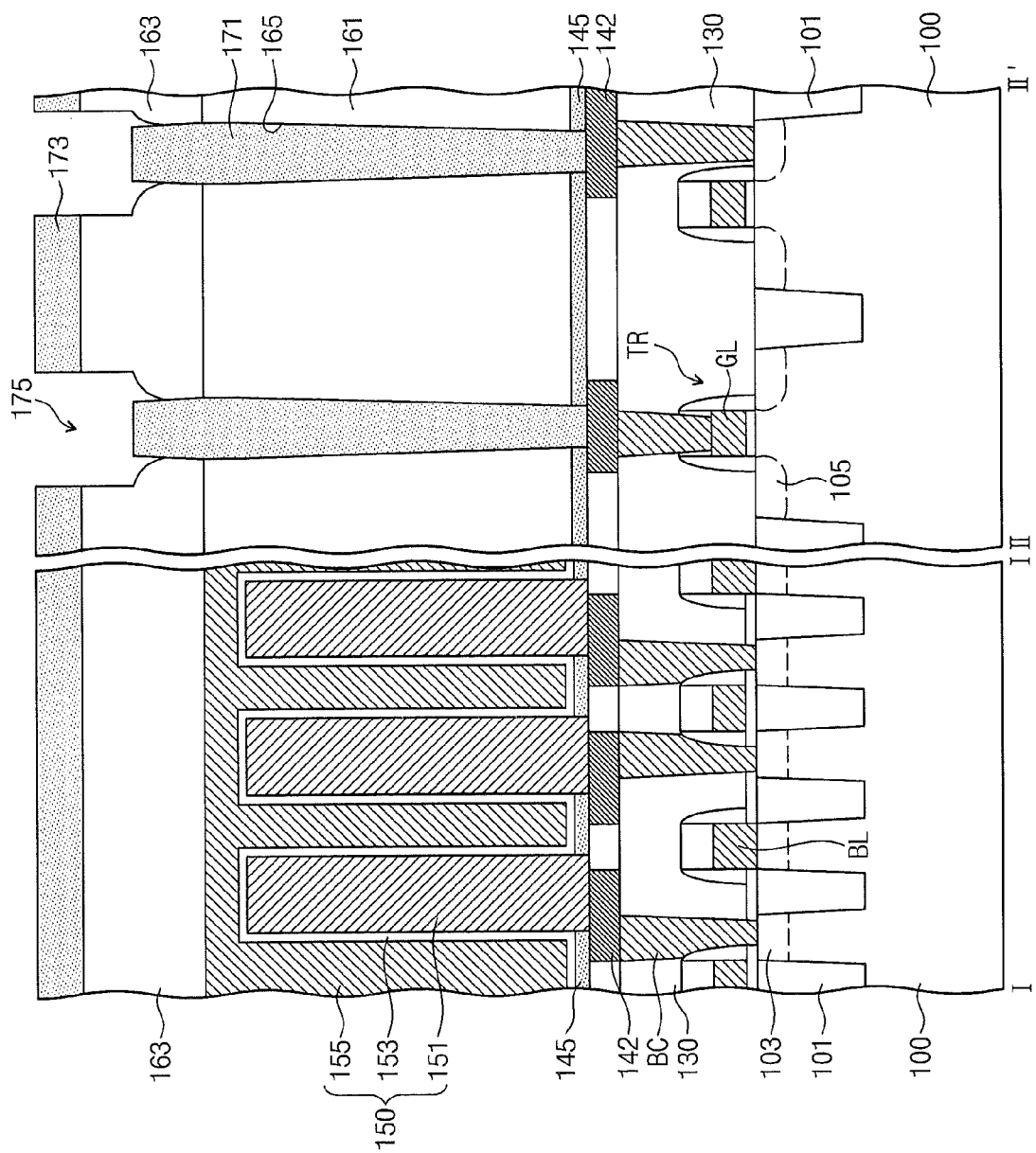

Referring to FIG. 22, trenches 175 may be formed in the second interlayered dielectric layer 161. The formation of the trenches 175 may be performed using the second mask pattern 173. The trenches 175 may be spaced apart from each other by a specific space in the first direction D1, as described with reference to FIG. 4, and each of them may be elongated along the second direction D2 or perpendicular to the first direction D1. In the present embodiment, bottom surfaces of the trenches 175 may be located over the top surface of the upper electrode 155 of the capacitor 150. For example, the bottom surfaces of the trenches 175 may be spaced apart from an interface between the second and third interlayered dielectric layers 161 and 163.

As described above, during the anisotropic etching process for forming the trenches 175, sidewalls of the second and third interlayered dielectric layers 161 and 163 in contact with the sacrificial layer 171 may be recessed or etched along a longitudinal direction of the trenches 175 or the second direction. For example, upper widths of the contact holes 165 in the second direction D2 may be increased during the formation of the trenches 175. In other words, after the formation of the trenches 175, in plan view, the upper width of the contact holes 165 may be greater in the second direction D2 than in the first direction D1. The contact holes 165 may have a lower sidewall slanted at a first angle relative to the underlying layer 10 and an upper sidewall slanted at a second angle relative to the underlying layer 10. The second angle may be smaller than the first angle.

Thereafter, the sacrificial layer 171 and the second mask pattern 173 may be removed to expose inner walls of the contact holes 165 and the trenches 175. The sacrificial layer 171 and the second mask pattern 173 may be removed using an ashing process or a wet cleaning process.

Figure 23:
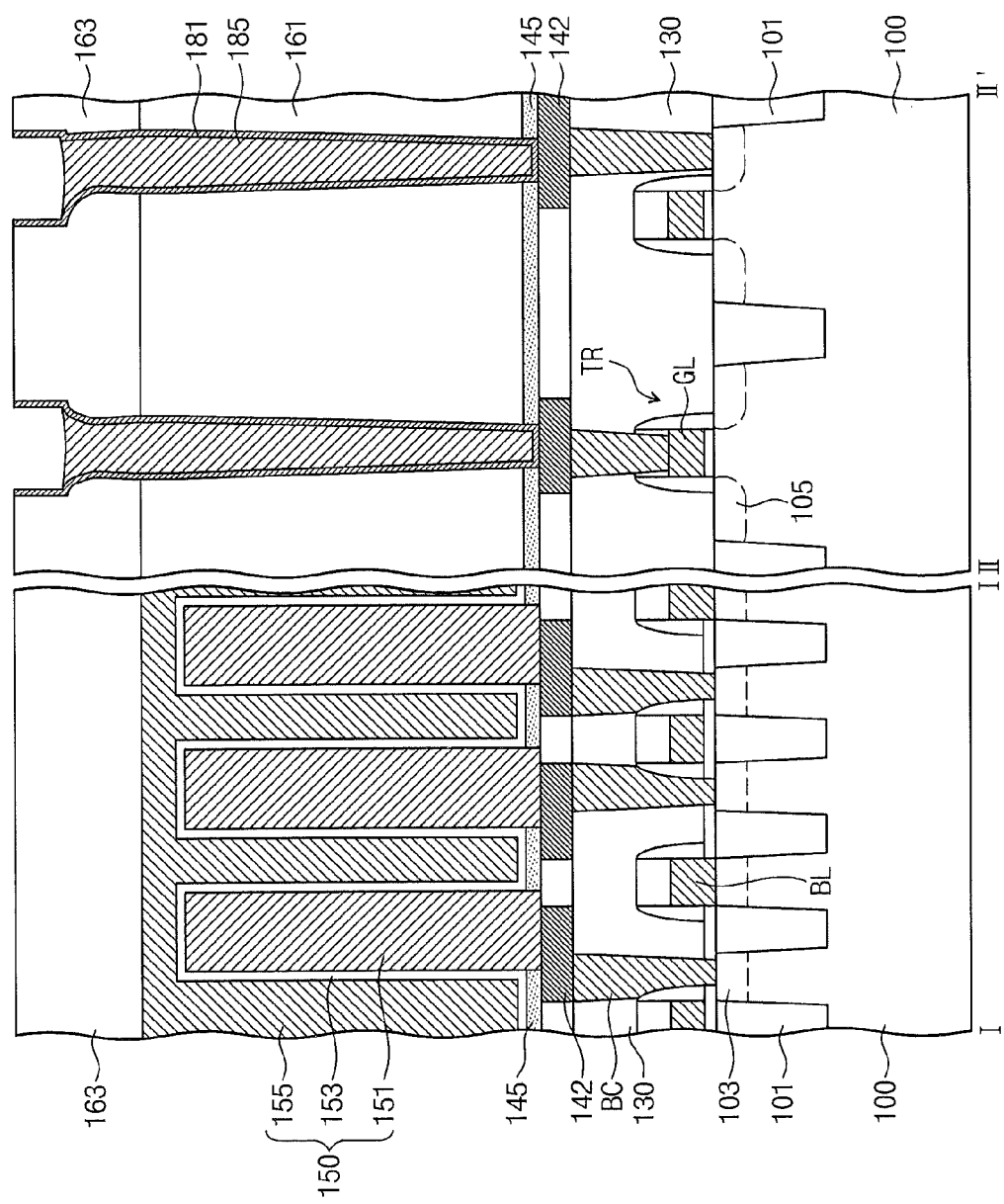

Referring to FIG. 23, as described with reference to FIGS. 5 and 6, a first barrier metal layer 181 and a metal plug 185 may be formed in each of the contact holes 165. For example, the first barrier metal layer 181 may be formed to cover the inner walls of the contact holes 165 and the trenches 175, and then, a first metal layer may be formed to fill the contact holes 165 and the trenches 175. The first metal layer may include tungsten. Thereafter, the first metal layer may be removed from the trenches 175 to form the metal plug 185. Accordingly, the first barrier metal layer 181 on bottom surfaces of the trenches 175 may be exposed.

Figure 24:
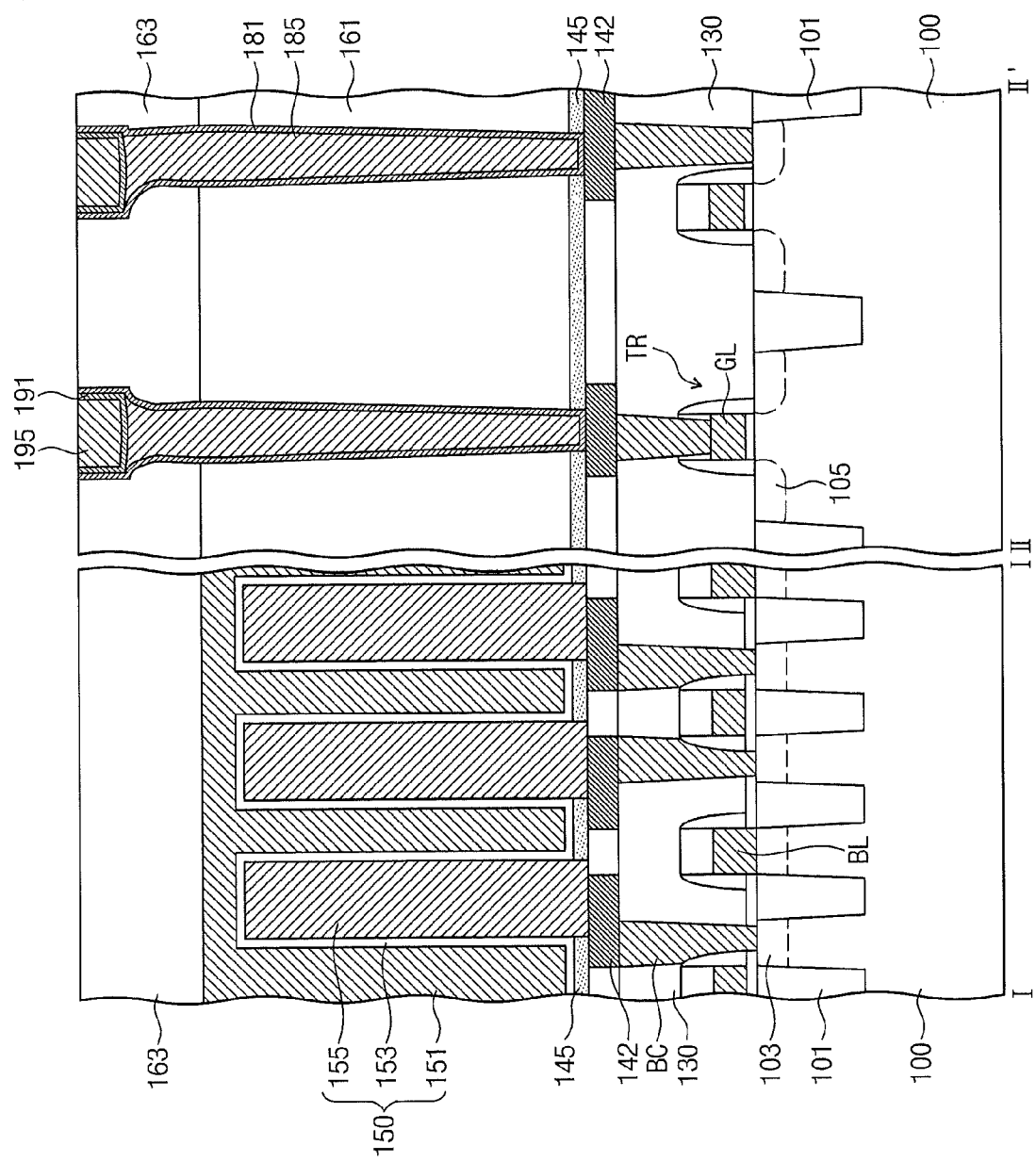

Referring to FIG. 24, as described with reference to FIG. 7, a second barrier metal layer 191 and a second metal layer 195 may be sequentially formed in the trenches 175. The second barrier metal layer 191 may be in direct contact with the first barrier metal layer 181 at the bottom and side surfaces of the trenches 175. The second metal layer 195 may include a metal material (e.g., copper or copper alloy), which may be different from the first metal layer 185.

According to example embodiments of the inventive concept, an interconnection structure may include a contact plug and an upper interconnection line that are formed of or include metal materials different from each other. Here, a sidewall of the contact plug may be formed to be different from top to bottom in terms of a slope angle with respect to an underlying layer. For example, in an extension direction of the upper interconnection line, a width of the contact plug may increase with decreasing distance from the upper interconnection line. Accordingly, a contact area between the contact plug and the upper interconnection line may be increased, and this makes it possible to improve electrical reliability of the interconnection structure.

Furthermore, the upper interconnection lines may be spaced apart from an interface between stacked insulating layers. Accordingly, it is possible to prevent metallic elements in the upper interconnection line from being moved along the interface between the stacked insulating layers, when the upper interconnection lines are applied with a predetermined voltage (e.g., power voltage).

While example embodiments of the inventive concepts have been particularly shown and described, it will be understood by one of ordinary skill in the art that variations in form and detail may be made therein without departing from the spirit and scope of the attached claims.

What is claimed is:

1. An interconnection structure of a semiconductor device, comprising:

an underlying layer including a lower interconnection;

an interlayered dielectric layer on a surface of the underlying layer, the interlayered dielectric layer comprising stacked dielectric layers including a contact hole and a trench in the stacked dielectric layers, the contact hole exposing a portion of the lower interconnection, and the trench extending along a first direction parallel to the surface of the underlying layer, wherein the trench is directly connected to the contact hole;

a contact plug in the contact hole of the interlayered dielectric layer, the contact plug comprising a unitary member having lower and upper portions, wherein a first upper width of the upper portion in the first direction is greater than a second upper width thereof in a second direction perpendicular to the first direction such that the upper portion has an elliptical cross-section in plan view, and wherein first and second lower widths of the lower portion in the first and second directions are substantially same such that the lower portion has a substantially circular cross-section in plan view; and an upper interconnection line in the trench of the interlayered dielectric layer and connected to the contact plug, wherein a width of the trench in the second direction is greater than the second upper width of the upper portion of the contact plug at an interface between the contact plug and the upper interconnection line adjacent a bottom surface of the trench, wherein the lower and upper portions of the contact plug include lower and upper sidewalls inclined at first and second angles, respectively, relative to the underlying layer, and wherein the second angle is less than the first angle, and wherein the unitary member of the contact plug comprises a first metal material, and the upper interconnection line comprises a second metal material of which a melting point is lower than that of the first metal material.

2. The interconnection structure of claim 1, wherein the first and second upper widths define a contact area between the contact plug and the upper interconnection line.

3. The interconnection structure of claim 2, wherein the first upper width of the upper portion of the contact plug in the first direction along the interface is greater than the width of the trench in the second direction along the interface.

4. The interconnection structure of claim 1, wherein the contact plug comprises:
a first barrier metal layer on inner surfaces of the contact hole and the trench, wherein the first metal material is in the contact hole on the first barrier metal layer.

5. The interconnection structure of claim 4, wherein the upper interconnection line comprises:
a second barrier metal layer on side and bottom surfaces of the trench; and
a second metal layer in the trench on the second barrier metal layer,
wherein the second barrier metal layer is in direct contact with the first barrier metal layer at the side and bottom surfaces of the trench, and
wherein the bottom surface of the trench is spaced apart from a dielectric interface between the stacked dielectric layers of the interlayered dielectric layer.

6. The interconnection structure of claim 1, wherein the contact plug comprises tungsten, and wherein the upper interconnection line comprises copper or copper alloy.

7. A semiconductor device, comprising:
a semiconductor substrate including a lower interconnection;
an interlayered dielectric layer including a contact hole and a trench, the contact hole exposing a portion of the lower interconnection, and the trench extending along a first direction to be connected to the contact hole;
a first barrier metal layer on inner surfaces of the contact hole and the trench, the first barrier metal layer being in direct contact with the inner surfaces of the contact hole and the trench;
a first metal layer in a portion of the contact hole provided with the first barrier metal layer, wherein the first metal layer is coplanar with or confined below a bottom surface of the trench, and wherein a width of the trench in a second direction perpendicular to the first direction is greater than a width of the contact hole in the second direction at the bottom surface of the trench;
a second barrier metal layer in direct contact with the first barrier metal layer at the bottom surface and side surfaces of the trench; and
a second metal layer in the trench provided with the second barrier metal layer such that the second barrier metal layer extends along an interface between the first metal layer and the second metal layer at the bottom surface of the trench,
wherein an upper portion of the first metal layer adjacent the interface has a first upper width in the first direction and a second upper width in the second direction, wherein the first upper width is greater than the second upper width such that the upper portion has an elliptical cross-section in plan view, wherein a lower portion of the first metal layer opposite the interface has first and second lower widths that are substantially same in the first and second directions such that the lower portion has a substantially circular cross-section in plan view, and wherein the upper and lower portions of the first metal layer are portions of a unitary member.

8. The device of claim 7, wherein the contact hole comprises lower and upper sidewalls inclined at first and second angles, respectively, relative to a surface of the substrate, and wherein the second angle is less than the first angle.

9. The device of claim 7, wherein the first and second upper widths define a contact area between the first metal layer and the second metal layer.

10. The device of claim 9, wherein the first upper width in the first direction is greater than the width of the trench in the second direction.

11. The device of claim 7, wherein the semiconductor substrate comprises a cell region including data storing elements and a peripheral circuit region including the contact hole and the trench, wherein the interlayered dielectric layer covers the data storing elements of the cell region, and wherein the unitary member extends through the interlayered dielectric layer from adjacent the lower interconnection below the data storing elements and away from the substrate beyond the data storing elements.

12. The device of claim 7, wherein the first metal layer comprises tungsten, and wherein the second metal layer comprises copper or copper alloy.

13. An interconnection structure, comprising:
a substrate;
an interlayer dielectric layer comprising stacked dielectric layers on the substrate;
a conductive plug in a contact hole extending through the stacked dielectric layers of the interlayer dielectric layer toward the substrate, the conductive plug comprising upper and lower sidewalls having different angles of inclination relative to a surface of the substrate; and
a conductive line extending along a first direction in a trench in the stacked dielectric layers of the interlayer dielectric layer and contacting the conductive plug opposite the substrate adjacent the upper sidewall,
wherein a floor of the trench is spaced apart from a dielectric interface between the stacked dielectric layers of the interlayer dielectric layer, wherein a width of the trench in a second direction perpendicular to the first direction is greater than a width of the conductive plug in the second direction at an interface between the conductive plug and the conductive line adjacent the floor of the trench, and wherein the conductive line comprises a metal having a higher charge mobility than that of the conductive plug, and
wherein the conductive plug comprises a unitary member having upper and lower portions adjacent the upper and lower sidewalls, respectively, wherein a dimension of the upper portion along the first direction is greater than a dimension thereof along the second direction such that the upper portion has an elliptical cross-section in plan view, and wherein dimensions of the lower portion along the first and second directions are substantially same such that the lower portion has a substantially circular cross-section in plan view.

14. The structure of claim 13, wherein the lower and upper sidewalls of the conductive plug are inclined at a first angle and a second angle, respectively, relative to the surface of the substrate, and wherein the second angle is less than the first angle.

15. The structure of claim 14, wherein a cross-sectional area of the upper portion of the conductive plug adjacent the upper sidewall thereof and contacting the conductive line at the interface therebetween is greater than a cross-sectional area of the lower portion of the conductive plug adjacent the lower sidewall thereof.

16. The structure of claim 15, wherein the dimension of the upper portion of the conductive plug along the first direction in which the conductive line extends is greater than a dimension of the conductive line along the second direction, wherein the dimensions of the upper portion of the conductive plug along the first and second directions define a contact area at the interface between the conductive plug and the conductive line.

17. The structure of claim 15, wherein a cross-sectional area of a bowed portion of the conductive plug between the upper and lower portions thereof is greater than that of the upper portion thereof.

18. The structure of claim 13, wherein the interlayer dielectric layer comprises at least two dielectric layers, and wherein the conductive line is spaced apart from an interface between the at least two dielectric layers.

19. The structure of claim 13, wherein the substrate comprises a cell region including data storage elements extending through the interlayer dielectric layer thereon and a peripheral circuit region including the conductive plug extending through the interlayer dielectric layer thereon, wherein the data storage elements and the conductive plug contact respective underlying transistors that are between the substrate and the interlayer dielectric layer in the cell region and the peripheral circuit region, and wherein the unitary member extends from the contact with one of the respective underlying transistors in the peripheral circuit region away from the substrate and beyond the data storage elements.

20. The structure of claim 13, further comprising a first barrier metal layer along sidewalls of the contact hole extending through the interlayer dielectric layer to the substrate, wherein the conductive line comprises a second barrier metal layer along sidewalls of the trench in the interlayer dielectric layer opposite the substrate, and wherein the second barrier layer is directly on the first barrier layer along at least a portion of sidewalls and the floor of the trench and extends along the interface between the conductive plug and the conductive line such that a contact area between the conductive plug and the second barrier metal layer is greater than a cross-sectional area of the conductive plug in the contact hole.

21. The structure of claim 20, wherein the unitary member of the conductive plug further comprises a first metal layer that is confined below the second barrier metal layer extending along the interface between the conductive plug and the conductive line at the floor of the trench, and wherein the conductive line comprises a second metal layer different than the first metal layer.

22. The structure of claim 20, wherein the contact hole has an aspect ratio of about 1:2 to about 1:10.

* * * * *